United States Patent
Khalil et al.

(10) Patent No.: US 10,751,250 B1
(45) Date of Patent: Aug. 25, 2020

(54) SYSTEM AND METHOD FOR BATTERY-BASED CONTROL OF A LOCKING DRUG RECEPTACLE

(71) Applicant: Express Scripts Strategic Development, Inc., St. Louis, MO (US)

(72) Inventors: Syed-Muasir Khalil, Austin, TX (US); Ankur Kaneria, Cedar Park, TX (US); Imaduldin Krad, Austin, TX (US); Kerra A. Bach, Chesterfield, MO (US); Igor Krasnykh, Round Rock, TX (US)

(73) Assignee: Express Scripts Strategic Development, Inc., St. Louis, MO (US)

( * ) Notice: Subject to any disclaimer, the term of this patent is extended or adjusted under 35 U.S.C. 154(b) by 51 days.

(21) Appl. No.: 15/972,378

(22) Filed: May 7, 2018

(51) Int. Cl.
    *H02J 7/00* (2006.01)
    *A61J 1/03* (2006.01)
    *H02J 7/02* (2016.01)

(52) U.S. Cl.
    CPC ............... *A61J 1/035* (2013.01); *H02J 7/025* (2013.01); *H02J 7/00034* (2020.01)

(58) Field of Classification Search
    CPC .................................. A61J 1/035; H02J 7/025
    USPC ........................................... 320/108; 307/104
    See application file for complete search history.

(56) References Cited

U.S. PATENT DOCUMENTS

| | | | |
|---|---|---|---|
| 5,616,140 A | 4/1997 | Prescott | |
| 6,138,865 A | 10/2000 | Gilmore | |
| 2004/0158350 A1 | 8/2004 | Ostergaard et al. | |
| 2007/0186923 A1 | 8/2007 | Poutiatine et al. | |
| 2011/0018494 A1* | 1/2011 | Mita | H02J 7/025 320/108 |
| 2011/0067363 A1* | 3/2011 | Sprada | B65D 83/0463 53/492 |
| 2016/0324726 A1* | 11/2016 | Roberts | A61J 7/02 |
| 2018/0034305 A1* | 2/2018 | Lee | H02J 50/60 |

\* cited by examiner

*Primary Examiner* — Zixuan Zhou

(74) *Attorney, Agent, or Firm* — Harness, Dickey & Pierce, PLC

(57) ABSTRACT

A charge adjustment device, located at a residence, includes a container identification module, a charge determination module, and a charge control module. The container identification module is configured to determine a prescription identifier (RX ID) of a cap attached to a container. The charge determination module is configured to establish a connection with a remote data source over a network and, according to the RX ID, obtain information indicating a desired charge amount of a battery of the cap. The charge control module is configured to selectively control additional charge to be supplied to the battery based on the desired charge amount.

20 Claims, 16 Drawing Sheets

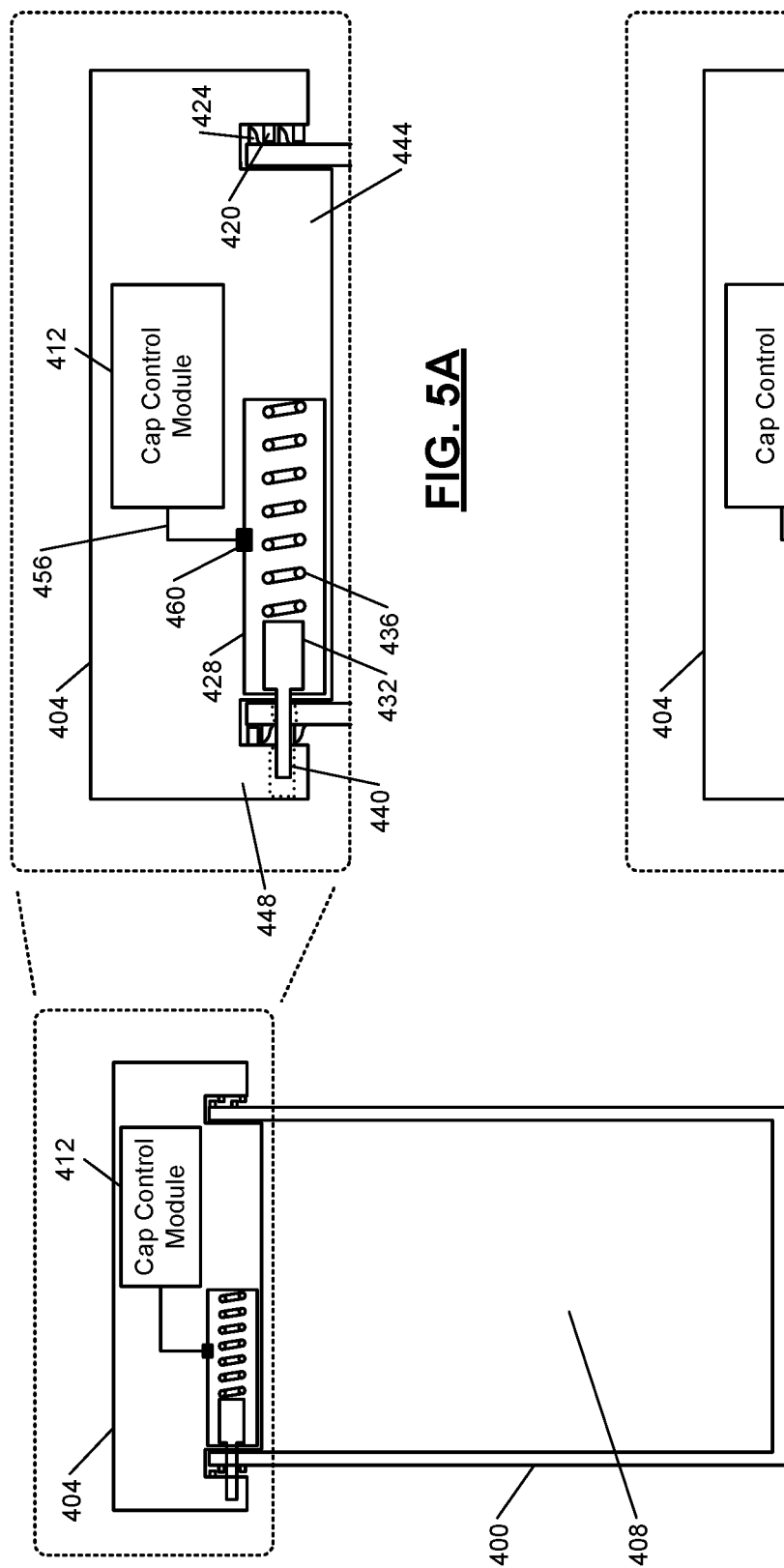

SYSTEM AND METHOD FOR BATTERY-BASED CONTROL OF A LOCKING DRUG RECEPTACLE

FIELD

The present disclosure relates to drug receptacles and, more particularly, to adjusting opening parameters of locking drug receptacles.

BACKGROUND

A pharmacy may provide regimen instructions and administration instructions to users to encourage user adherence to a prescription regimen. However, while prescription and regimen information is available, a number of users may not read the information or ask the necessary questions of a pharmacist or their doctor. Adherence may be encouraged by guarding access to the prescription. For example, certain prescriptions may only be refilled a few days before the user is scheduled to need the prescription or may be refilled with only a small quantity at a time.

Other than limiting when the user receives the prescription, enforcing adherence to the prescription regimen is difficult. Adherence is particularly difficult in situations where there is a high likelihood the user or others will abuse the prescription or when the user has difficulty tracking prescription administration. While labelling prescriptions with an expiration date usually prevents the administration of expired prescription drugs, there are no active systems to prevent expired prescription drug access once dispensed to a user.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A charge adjustment device, located at a residence, includes a container identification module, a charge determination module, and a charge control module. The container identification module is configured to determine a prescription identifier (RX ID) of a cap attached to a container. The charge determination module is configured to establish a connection with a remote data source over a network and, according to the RX ID, obtain information indicating a desired charge amount of a battery of the cap. The charge control module is configured to selectively control additional charge to be supplied to the battery based on the desired charge amount.

In other features, the charge adjustment device includes a charging module configured to provide the additional charge to the battery. In other features, the charging module is configured to wirelessly transmit the additional charge to the cap. In other features, the charge control module is configured to control supplemental charge storage in the cap to supply the additional charge to the battery. In other features, the desired charge amount indicates one of: (i) a voltage level of the battery and (ii) an additional charge time for the battery. In other features, the obtained information is the desired charge amount. In other features, the charge determination module calculates the desired charge amount based on the obtained information.

In other features, the obtained information includes a transit time indicating a number of days the container was in transit to the residence, and the charge determination module is configured to calculate the desired charge amount based on the transit time. In other features, the obtained information includes an initial charge level of the battery and a length of time for which access to the container is to be permitted, and the charge determination module is configured to calculate the desired charge amount based on the initial charge level and the length of time. In other features, the obtained information includes an initial charge level of the battery, a quantity of drugs in the container, and a prescribed number of drugs to be taken per day. In other features, the charge determination module is configured to calculate a length of time based on the quantity of drugs in the container and the prescribed number of drugs to be taken per day, and to calculate the desired charge amount based on the initial charge level and the length of time.

A system includes the charge adjustment device and the cap. The cap includes a pushbutton, and a lock control module configured to, in response to actuation of the pushbutton, selectively unlock the cap to permit separation of the cap from the container. In other features, the cap includes a solenoid that selectively prevents movement of the cap with respect to the container, and the lock control module is configured to connect the battery to the solenoid to unlock the cap. In other features, the lock control module is configured to unlock the cap only in response to determining based on the obtained information that access is permitted to the container.

In other features, the lock control module is configured to determine whether access is permitted to the container based on a comparison of a current date to regimen instructions programmed into the cap. In other features, the lock control module is configured to determine whether access is permitted to the container based on a comparison of the current date and a current time to the regimen instructions. In other features, the lock control module is configured to update the regimen instructions based on information from the remote data source received wirelessly from the charge adjustment device.

In other features, the container identification module is configured to determine the RX ID of the cap based on a wireless network identifier of a wireless communication circuit of the cap. In other features, the container identification module is configured to determine the RX ID of the cap by reading a printed image on the cap that encodes the RX ID. In other features, the container identification module is configured to receive a message including the RX ID from the cap over a wireless communication channel. In other features, the charge control module is configured to, in response to the information indicating that access to the container should be terminated, control a dissipation circuit of the cap to dissipate charge from the battery.

A method of adjusting charge of a battery in a cap attached to a container includes determining a prescription identifier (RX ID) of the cap corresponding to drugs located within the container. The method includes establishing a connection with a remote data source over a network. The method includes obtaining information, according to the RX ID, indicating a desired charge amount of the battery of the cap. The method includes selectively controlling additional charge to be supplied to the battery based on the desired charge amount.

In other features, the additional charge is provided to the battery from a charging module physically distinct from the cap. In other features, the additional charge is wirelessly transmitted to the cap using the charging module. In other features, the method includes controlling a supplemental charge storage in the cap to supply the additional charge to the battery.

In other features, the desired charge amount indicates one of: (i) a voltage level of the battery and (ii) an additional charge time for the battery. In other features, the obtained information is the desired charge amount. In other features, the method includes calculating the desired charge amount based on the obtained information. In other features, the obtained information includes a transit time indicating a number of days the container was in transit to a residence. The desired charge amount is calculated based on the transit time.

In other features, the obtained information includes an initial charge level of the battery and a length of time for which access to the container is to be permitted, and the desired charge amount is calculated based on the initial charge level and the length of time. In other features, the obtained information includes an initial charge level of the battery, a quantity of drugs in the container, and a prescribed number of drugs to be taken per day, the method includes calculating a length of time based on the quantity of drugs in the container and the prescribed number of drugs to be taken per day, and the desired charge amount is calculated based on the initial charge level and the length of time.

In other features, the method includes, in response to receiving an actuation signal from a pushbutton, selectively unlocking the cap to permit separation of the cap from the container. In other features, the cap includes a solenoid that selectively prevents movement of the cap with respect to the container, and the method includes connecting the battery to the solenoid to unlock the cap in response to an open signal from a lock control module. In other features, the method includes determining whether access is permitted to the container based on the obtained information. The cap is only unlocked in response to determining that access is permitted to the container. In other features, the determination is made based on a comparison of a current date to regimen instructions programmed into the cap. In other features, the determination is made based on a comparison of the current date and a current time to the regimen instructions.

In other features, the method includes updating the regimen instructions based on information from the remote data source received wirelessly from a charge adjustment device. In other features, the method includes determining the RX ID of the cap based on a wireless network identifier of a wireless communication circuit of the cap. In other features, the method includes determining the RX ID of the cap by reading a printed image on the cap that encodes the RX ID. In other features, the method includes receiving a message received from the cap over a wireless communication channel and determining the RX ID from the received message. In other features, the method includes, in response to the information indicating that access to the container should be terminated, controlling a dissipation circuit of the cap to dissipate charge from the battery.

A non-transitory computer-readable medium stores processor-executable instructions. The instructions include determining a prescription identifier (RX ID) of a cap attached to a container, establishing a connection with a remote data source over a network, obtaining information, according to the RX ID, indicating a desired charge amount of a battery of the cap, and selectively controlling additional charge to be supplied to the battery based on the desired charge amount.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 4 is a graphical representation of a side view of an example container including an example locking cap.

FIG. 5A is a graphical representation of an expanded side view of the cap of FIG. 4 in a locked position.

FIG. 5B is a graphical representation of an expanded side view of the cap of FIG. 4 in an unlocked position.

In the drawings, reference numbers may be reused to identify similar and/or identical elements.

DETAILED DESCRIPTION

Introduction

Figure 1:
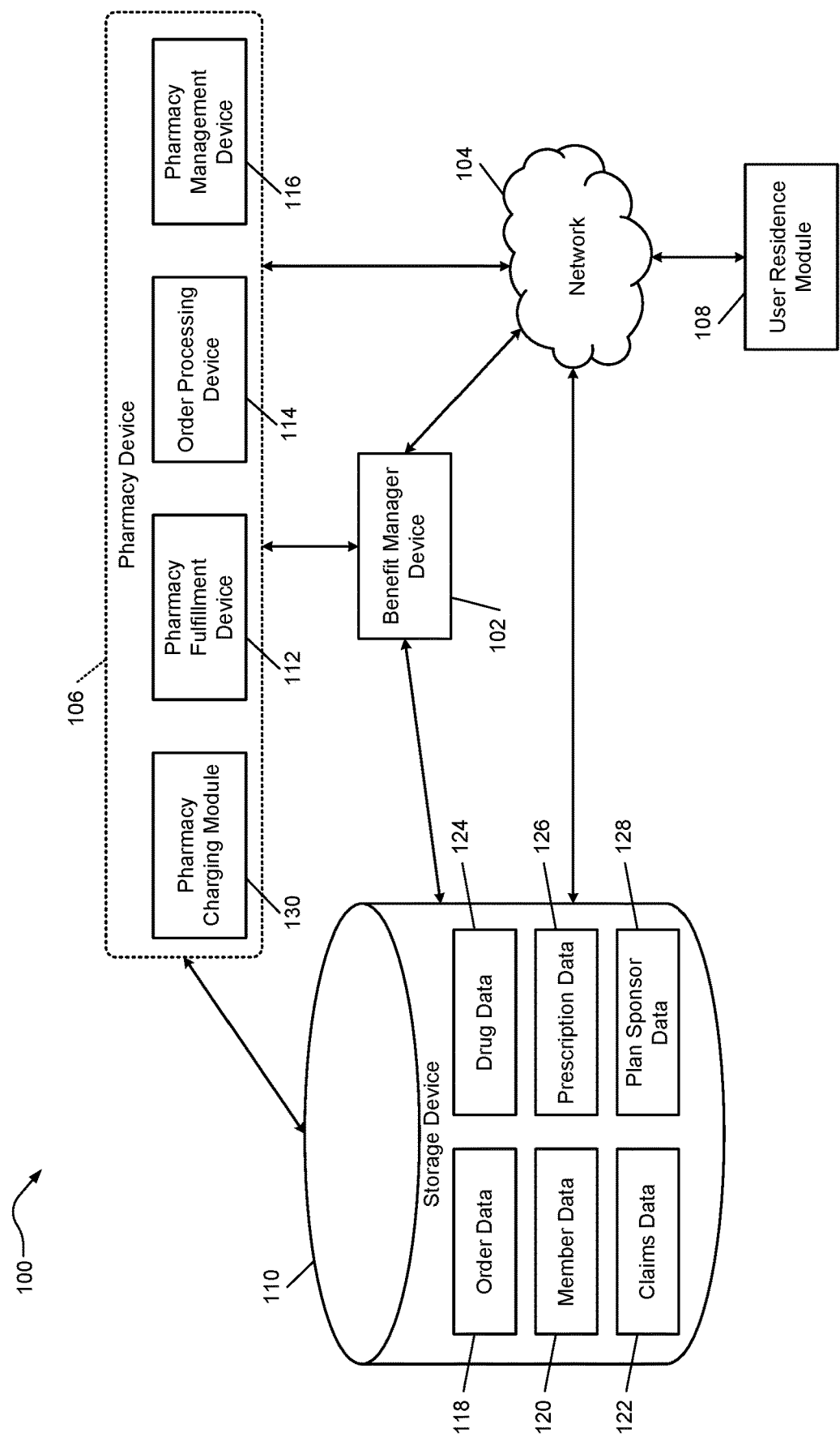
FIG. 1 is a functional block diagram of an example system including a high-volume pharmacy.

To prevent unapproved access to a prescription container, a cap of the prescription container is outfitted with a locking mechanism. The locking mechanism secures the cap on the container. The cap includes a cap control module that permits unlocking of the container as long as a battery of the cap is sufficiently charged. The battery supplies current to a battery switch, actuating the locking mechanism into an unlocked position. While the locking mechanism is in the unlocked position, the cap is not secured to the container, and the user can twist the cap off the container.

The battery is charged at a pharmacy according to a prescription course of a prescription regimen. The prescription course indicates an amount of time the prescription should be administered—for example, a certain number of days. The battery charge will expire once the prescription course is complete, and the user will no longer be able to remove the cap from the container. That is, once the charge of the battery is drained, the locking mechanism can no longer operate and the cap cannot be opened.

In addition to charging the battery at the pharmacy, a user residence module may be implemented to charge the battery as needed at the user's residence. The user residence module can wirelessly charge the battery in accordance with delivery delays or changes to the prescription course. Additionally, the user residence module communicates with the pharmacy to receive updated prescription regimen information that includes updates to the prescription course.

In various implementations, the user residence module can determine when to charge (wirelessly or wired, such as via conductive contacts) the battery based on regimen instructions received from the pharmacy. The user residence module can add charge to the battery if, for example, the pharmacy has extended the prescription course or there were delivery delays.

In various implementations, the cap control module includes onboard supplemental charge storage. In response to conditions similar to those described above, the user residence module can control the supplemental charge storage to charge the battery.

In various implementations, the cap control module may include a dissipation device capable of draining the battery to below an operating level. The user residence module communicates with the pharmacy and, in the circumstance that the prescription was canceled, recalled, expired, etc., the user residence module can disable access by controlling the dissipation device to drain the battery of the cap.

In various implementations, the cap can be a smart cap that simulates a virtual charge for the battery. In other words, the battery in the smart cap may not physically have a low charge, but in response to expiration of the prescription, the smart cap acts as if the battery charge has fallen below an operational level. The smart cap may be configured to receive updated regimen instructions from the pharmacy and control access to the prescription accordingly. For example, the user residence module may communicate the updated regimen instructions from the pharmacy to the smart cap.

The smart cap includes a lock control module that determines, based on the updated regimen instructions, whether and when to unlock the cap. For example, the cap can include a pushbutton that the user presses to request access to the cap. The lock control module can unlock the cap in response to actuation of the pushbutton as long as the regimen instructions indicate that the prescription should be administered at the current day and time, and/or the prescription has been administered fewer than a maximum number of times.

High-Volume Pharmacy

FIG. 1 is a block diagram of an example implementation of a system 100 for a high-volume pharmacy. While the system 100 is generally described as being deployed in a high-volume pharmacy or a fulfillment center (for example, a mail order pharmacy, a direct delivery pharmacy, etc.), the system 100 and/or components of the system 100 may otherwise be deployed (for example, in a lower-volume pharmacy, etc.). A high-volume pharmacy may be a pharmacy that is capable of filling at least some prescriptions mechanically. The system 100 may include a benefit manager device 102 and a pharmacy device 106 in communication with each other directly and/or over a network 104. The system 100 may also include a storage device 110.

The benefit manager device 102 is a device operated by an entity that is at least partially responsible for creation and/or management of the pharmacy or drug benefit. While the entity operating the benefit manager device 102 is typically a pharmacy benefit manager (PBM), other entities may operate the benefit manager device 102 on behalf of themselves or other entities (such as PBMs). For example, the benefit manager device 102 may be operated by a health plan, a retail pharmacy chain, a drug wholesaler, a data analytics or other type of software-related company, etc. In some implementations, a PBM that provides the pharmacy benefit may provide one or more additional benefits including a medical or health benefit, a dental benefit, a vision benefit, a wellness benefit, a radiology benefit, a pet care benefit, an insurance benefit, a long term care benefit, a nursing home benefit, etc. The PBM may, in addition to its PBM operations, operate one or more pharmacies. The pharmacies may be retail pharmacies, mail order pharmacies, etc.

Some of the operations of the PBM that operates the benefit manager device 102 may include the following activities and processes. A member (or a person on behalf of the member) of a pharmacy benefit plan may obtain a prescription drug at a retail pharmacy location (e.g., a location of a physical store) from a pharmacist or a pharmacist technician. The member may also obtain the prescription drug through mail order drug delivery from a mail order pharmacy location, such as the system 100. In some implementations, the member may obtain the prescription drug directly or indirectly through the use of a machine, such as a kiosk, a vending unit, a mobile electronic device, or a different type of mechanical device, electrical device, electronic communication device, and/or computing device. Such a machine may be filled with the prescription drug in prescription packaging, which may include multiple prescription components, by the system 100. The pharmacy benefit plan is administered by or through the benefit manager device 102.

The member may have a copayment for the prescription drug that reflects an amount of money that the member is responsible to pay the pharmacy for the prescription drug. The money paid by the member to the pharmacy may come from, as examples, personal funds of the member, a health savings account (HSA) of the member or the member's family, a health reimbursement arrangement (HRA) of the member or the member's family, or a flexible spending account (FSA) of the member or the member's family. In some instances, an employer of the member may directly or indirectly fund or reimburse the member for the copayments.

The amount of the copayment required by the member may vary across different pharmacy benefit plans having different plan sponsors or clients and/or for different prescription drugs. The member's copayment may be a flat copayment (in one example, $10), coinsurance (in one example, 10%), and/or a deductible (for example, responsibility for the first $500 of annual prescription drug expense, etc.) for certain prescription drugs, certain types and/or classes of prescription drugs, and/or all prescription drugs. The copayment may be stored in the storage device 110 or determined by the benefit manager device 102.

In some instances, the member may not pay the copayment or may only pay a portion of the copayment for the prescription drug. For example, if a usual and customary cost for a generic version of a prescription drug is $4, and the member's flat copayment is $20 for the prescription drug, the member may only need to pay $4 to receive the prescription drug. In another example involving a worker's compensation claim, no copayment may be due by the member for the prescription drug.

In addition, copayments may also vary based on different delivery channels for the prescription drug. For example, the copayment for receiving the prescription drug from a mail order pharmacy location may be less than the copayment for receiving the prescription drug from a retail pharmacy location.

In conjunction with receiving a copayment (if any) from the member and dispensing the prescription drug to the member, the pharmacy submits a claim to the PBM for the prescription drug. After receiving the claim, the PBM (such as by using the benefit manager device 102) may perform certain adjudication operations including verifying eligibility for the member, identifying/reviewing an applicable formulary for the member to determine any appropriate copayment, coinsurance, and deductible for the prescription drug, and performing a drug utilization review (DUR) for the member. Further, the PBM may provide a response to the pharmacy (for example, the pharmacy system 100) following performance of at least some of the aforementioned operations.

As part of the adjudication, a plan sponsor (or the PBM on behalf of the plan sponsor) ultimately reimburses the pharmacy for filling the prescription drug when the prescription drug was successfully adjudicated. The aforementioned adjudication operations generally occur before the copayment is received and the prescription drug is dispensed. However in some instances, these operations may occur simultaneously, substantially simultaneously, or in a different order. In addition, more or fewer adjudication operations may be performed as at least part of the adjudication process.

The amount of reimbursement paid to the pharmacy by a plan sponsor and/or money paid by the member may be determined at least partially based on types of pharmacy networks in which the pharmacy is included. In some implementations, the amount may also be determined based on other factors. For example, if the member pays the pharmacy for the prescription drug without using the prescription or drug benefit provided by the PBM, the amount of money paid by the member may be higher than when the member uses the prescription or drug benefit. In some implementations, the amount of money received by the pharmacy for dispensing the prescription drug and for the prescription drug itself may be higher than when the member uses the prescription or drug benefit. Some or all of the foregoing operations may be performed by executing instructions stored in the benefit manager device 102 and/or an additional device.

Examples of the network 104 include a Global System for Mobile Communications (GSM) network, a code division multiple access (CDMA) network, 3rd Generation Partnership Project (3GPP), an Internet Protocol (IP) network, a Wireless Application Protocol (WAP) network, or an IEEE 802.11 standards network, as well as various combinations of the above networks. The network 104 may include an optical network. The network 104 may be a local area network or a global communication network, such as the Internet. In some implementations, the network 104 may include a network dedicated to prescription orders: a prescribing network such as the electronic prescribing network operated by Surescripts of Arlington, Va.

Moreover, although the system shows a single network 104, multiple networks can be used. The multiple networks may communicate in series and/or parallel with each other to link the devices 102-110.

The pharmacy device 106 may be a device associated with a retail pharmacy location (e.g., an exclusive pharmacy location, a grocery store with a retail pharmacy, or a general sales store with a retail pharmacy) or other type of pharmacy location at which a member attempts to obtain a prescription. The pharmacy may use the pharmacy device 106 to submit the claim to the PBM for adjudication.

Additionally, in some implementations, the pharmacy device 106 may enable information exchange between the pharmacy and the PBM. For example, this may allow the sharing of member information such as drug history that may allow the pharmacy to better service a member (for example, by providing more informed therapy consultation and drug interaction information). In some implementations, the benefit manager device 102 may track prescription drug fulfillment and/or other information for users that are not members, or have not identified themselves as members, at the time (or in conjunction with the time) in which they seek to have a prescription filled at a pharmacy.

The pharmacy device 106 may include a pharmacy fulfillment device 112, an order processing device 114, a pharmacy management device 116, and a pharmacy charging module 130 in communication with each other directly and/or over the network 104.

The order processing device 114 may receive information regarding filling prescriptions and may direct an order component to one or more devices of the pharmacy fulfillment device 112 at a pharmacy. The pharmacy fulfillment device 112 may fulfill, dispense, aggregate, and/or pack the order components of the prescription drugs in accordance with one or more prescription orders directed by the order processing device 114.

In general, the order processing device 114 is a device located within or otherwise associated with the pharmacy to enable the pharmacy fulfillment device 112 to fulfill a prescription and dispense prescription drugs. In some implementations, the order processing device 114 may be an external order processing device separate from the pharmacy and in communication with other devices located within the pharmacy.

For example, the external order processing device may communicate with an internal pharmacy order processing device and/or other devices located within the system 100. In some implementations, the external order processing device may have limited functionality (e.g., as operated by a user requesting fulfillment of a prescription drug), while the internal pharmacy order processing device may have greater functionality (e.g., as operated by a pharmacist).

The order processing device 114 may track the prescription order as it is fulfilled by the pharmacy fulfillment device 112. The prescription order may include one or more prescription drugs to be filled by the pharmacy. The order processing device 114 may make pharmacy routing decisions and/or order consolidation decisions for the particular prescription order. The pharmacy routing decisions include what device(s) in the pharmacy are responsible for filling or otherwise handling certain portions of the prescription order. The order consolidation decisions include whether portions of one prescription order or multiple prescription orders should be shipped together for a user or a user family. The order processing device 114 may also track and/or schedule literature or paperwork associated with each prescription order or multiple prescription orders that are being shipped together. In some implementations, the order processing device 114 may operate in combination with the pharmacy management device 116.

The order processing device 114 may include circuitry, a processor, a memory to store data and instructions, and communication functionality. The order processing device 114 is dedicated to performing processes, methods, and/or instructions described in this application. Other types of electronic devices may also be used that are specifically configured to implement the processes, methods, and/or instructions described in further detail below.

In some implementations, at least some functionality of the order processing device 114 may be included in the pharmacy management device 116. The order processing device 114 may be in a client-server relationship with the pharmacy management device 116, in a peer-to-peer relationship with the pharmacy management device 116, or in a different type of relationship with the pharmacy management device 116. The order processing device 114 and/or the pharmacy management device 116 may communicate directly (for example, such as by using a local storage) and/or through the network 104 (such as by using a cloud storage configuration, software as a service, etc.) with the storage device 110.

The storage device 110 may include: non-transitory storage (for example, memory, hard disk, CD-ROM, etc.) in communication with the benefit manager device 102 and/or the pharmacy device 106 directly and/or over the network 104. The non-transitory storage may store order data 118, member data 120, claims data 122, drug data 124, prescription data 126, and/or plan sponsor data 128. Further, the system 100 may include additional devices, which may communicate with each other directly or over the network 104.

The order data 118 may be related to a prescription order. The order data may include type of the prescription drug (for example, drug name and strength) and quantity of the prescription drug. The order data 118 may also include data used for completion of the prescription, such as prescription materials. In general, prescription materials include an electronic copy of information regarding the prescription drug for inclusion with or otherwise in conjunction with the fulfilled prescription. The prescription materials may include electronic information regarding drug interaction warnings, recommended usage, possible side effects, expiration date, date of prescribing, etc. The order data 118 may be used by a high-volume fulfillment center to fulfill a pharmacy order.

In some implementations, the order data 118 includes verification information associated with fulfillment of the prescription in the pharmacy. For example, the order data 118 may include videos and/or images taken of (i) the prescription drug prior to dispensing, during dispensing, and/or after dispensing, (ii) the prescription container (for example, a prescription container and sealing lid, prescription packaging, etc.) used to contain the prescription drug prior to dispensing, during dispensing, and/or after dispensing, (iii) the packaging and/or packaging materials used to ship or otherwise deliver the prescription drug prior to dispensing, during dispensing, and/or after dispensing, and/or (iv) the fulfillment process within the pharmacy. Other types of verification information such as barcode data read from pallets, bins, trays, or carts used to transport prescriptions within the pharmacy may also be stored as order data 118.

The member data 120 includes information regarding the members associated with the PBM. The information stored as member data 120 may include personal information, personal health information, protected health information, etc. Examples of the member data 120 include name, address, telephone number, e-mail address, prescription drug history, etc. The member data 120 may include a plan sponsor identifier that identifies the plan sponsor associated with the member and/or a member identifier that identifies the member to the plan sponsor. The member data 120 may include a member identifier that identifies the plan sponsor associated with the user and/or a user identifier that identifies the user to the plan sponsor. The member data 120 may also include dispensation preferences such as type of label, type of cap, message preferences, language preferences, etc.

The member data 120 may be accessed by various devices in the pharmacy (for example, the high-volume fulfillment center, etc.) to obtain information used for fulfillment and shipping of prescription orders. In some implementations, an external order processing device operated by or on behalf of a member may have access to at least a portion of the member data 120 for review, verification, or other purposes.

In some implementations, the member data 120 may include information for persons who are users of the pharmacy but are not members in the pharmacy benefit plan being provided by the PBM. For example, these users may obtain drugs directly from the pharmacy, through a private label service offered by the pharmacy, the high-volume fulfillment center, or otherwise. In general, the use of the terms "member" and "user" may be used interchangeably.

The claims data 122 includes information regarding pharmacy claims adjudicated by the PBM under a drug benefit program provided by the PBM for one or more plan sponsors. In general, the claims data 122 includes an identification of the client that sponsors the drug benefit program under which the claim is made, and/or the member that purchased the prescription drug giving rise to the claim, the prescription drug that was filled by the pharmacy (e.g., the national drug code number, etc.), the dispensing date, generic indicator, generic product identifier (GPI) number, medication class, the cost of the prescription drug provided under the drug benefit program, the copayment/coinsurance amount, rebate information, and/or member eligibility, etc. Additional information may be included.

In some implementations, other types of claims beyond prescription drug claims may be stored in the claims data 122. For example, medical claims, dental claims, wellness claims, or other types of health-care-related claims for members may be stored as a portion of the claims data 122.

In some implementations, the claims data 122 includes claims that identify the members with whom the claims are associated. Additionally or alternatively, the claims data 122 may include claims that have been de-identified (that is, associated with a unique identifier but not with a particular, identifiable member).

The drug data 124 may include drug name (e.g., technical name and/or common name), other names by which the drug is known, active ingredients, an image of the drug (such as in pill form), etc. The drug data 124 may include information associated with a single medication or multiple medications.

The prescription data 126 may include information regarding prescriptions that may be issued by prescribers on behalf of users, who may be members of the pharmacy benefit plan—for example, to be filled by a pharmacy.

Examples of the prescription data 126 include user names, medication or treatment (such as lab tests), dosing information, etc. The prescriptions may include electronic prescriptions or paper prescriptions that have been scanned. In some implementations, the dosing information reflects a frequency of use (e.g., once a day, twice a day, before each meal, etc.) and a duration of use (e.g., a few days, a week, a few weeks, a month, etc.).

In some implementations, the order data 118 may be linked to associated member data 120, claims data 122, drug data 124, and/or prescription data 126.

The plan sponsor data 128 includes information regarding the plan sponsors of the PBM. Examples of the plan sponsor data 128 include company name, company address, contact name, contact telephone number, contact e-mail address, etc.

Figure 2:
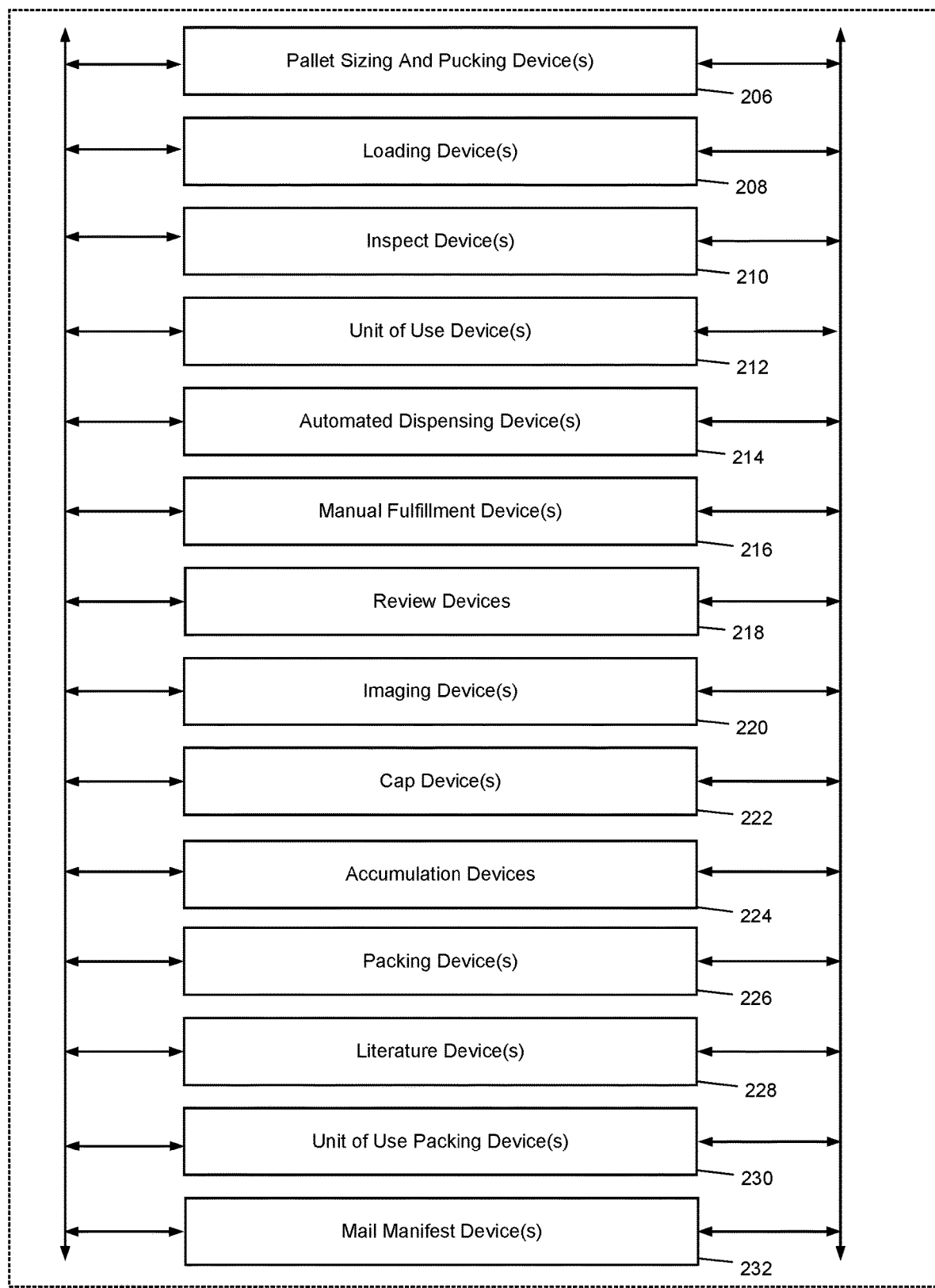
FIG. 2 is a functional block diagram of an example pharmacy fulfillment device, which may be deployed within the system of FIG. 1.

FIG. 2 illustrates the pharmacy fulfillment device 112 according to an example implementation. The pharmacy fulfillment device 112 may be used to process and fulfill prescriptions and prescription orders. After fulfillment, the fulfilled prescriptions are packed for shipping.

The pharmacy fulfillment device 112 may include devices in communication with the benefit manager device 102, the order processing device 114, and/or the storage device 110, directly or over the network 104. Specifically, the pharmacy fulfillment device 112 may include pallet sizing and pucking device(s) 206, loading device(s) 208, inspect device(s) 210, unit of use device(s) 212, automated dispensing device(s) 214, manual fulfillment device(s) 216, review devices 218, imaging device(s) 220, cap device(s) 222, accumulation devices 224, packing device(s) 226, literature device(s) 228, unit of use packing device(s) 230, and mail manifest device(s) 232. Further, the pharmacy fulfillment device 112 may include additional devices, which may communicate with each other directly or over the network 104.

In some implementations, operations performed by one of these devices 206-232 may be performed sequentially, or in parallel with the operations of another device as may be coordinated by the order processing device 114. In some implementations, the order processing device 114 tracks a prescription with the pharmacy based on operations performed by one or more of the devices 206-232.

In some implementations, the pharmacy fulfillment device 112 may transport prescription drug containers, for example, among the devices 206-232 in the high-volume fulfillment center, by use of pallets. The pallet sizing and pucking device 206 may configure pucks in a pallet. A pallet may be a transport structure for a number of prescription containers, and may include a number of cavities. A puck may be placed in one or more than one of the cavities in a pallet by the pallet sizing and pucking device 206. The puck may include a receptacle sized and shaped to receive a prescription container. Such containers may be supported by the pucks during carriage in the pallet. Different pucks may have differently sized and shaped receptacles to accommodate containers of differing sizes, as may be appropriate for different prescriptions.

The arrangement of pucks in a pallet may be determined by the order processing device 114 based on prescriptions that the order processing device 114 decides to launch. The arrangement logic may be implemented directly in the pallet sizing and pucking device 206. Once a prescription is set to be launched, a puck suitable for the appropriate size of container for that prescription may be positioned in a pallet by a robotic arm or pickers. The pallet sizing and pucking device 206 may launch a pallet once pucks have been configured in the pallet.

The loading device 208 may load prescription containers into the pucks on a pallet by a robotic arm, a pick and place mechanism (also referred to as pickers), etc. In various implementations, the loading device 208 has robotic arms or pickers to grasp a prescription container and move it to and from a pallet or a puck. The loading device 208 may also print a label that is appropriate for a container that is to be loaded onto the pallet, and apply the label to the container. The pallet may be located on a conveyor assembly during these operations (e.g., at the high-volume fulfillment center, etc.).

The inspect device 210 may verify that containers in a pallet are correctly labeled and in the correct spot on the pallet. The inspect device 210 may scan the label on one or more containers on the pallet. Labels of containers may be scanned or imaged in full or in part by the inspect device 210. Such imaging may occur after the container has been lifted out of its puck by a robotic arm, picker, etc., or may be otherwise scanned or imaged while retained in the puck. In some implementations, images and/or video captured by the inspect device 210 may be stored in the storage device 110 as order data 118.

The unit of use device 212 may temporarily store, monitor, label, and/or dispense unit of use products. In general, unit of use products are prescription drug products that may be delivered to a user or member without being repackaged at the pharmacy. These products may include pills in a container, pills in a blister pack, inhalers, etc. Prescription drug products dispensed by the unit of use device 212 may be packaged individually or collectively for shipping, or may be shipped in combination with other prescription drugs dispensed by other devices in the high-volume fulfillment center.

At least some of the operations of the devices 206-232 may be directed by the order processing device 114. For example, the manual fulfillment device 216, the review device 218, the automated dispensing device 214, and/or the packing device 226, etc. may receive instructions provided by the order processing device 114.

The automated dispensing device 214 may include one or more devices that dispense prescription drugs or pharmaceuticals into prescription containers in accordance with one or multiple prescription orders. In general, the automated dispensing device 214 may include mechanical and electronic components with, in some implementations, software and/or logic to facilitate pharmaceutical dispensing that would otherwise be performed in a manual fashion by a pharmacist and/or pharmacist technician. For example, the automated dispensing device 214 may include high-volume fillers that fill a number of prescription drug types at a rapid rate and blister pack machines that dispense and pack drugs into a blister pack. Prescription drugs dispensed by the automated dispensing devices 214 may be packaged individually or collectively for shipping, or may be shipped in combination with other prescription drugs dispensed by other devices in the high-volume fulfillment center.

The manual fulfillment device 216 controls how prescriptions are manually fulfilled. For example, the manual fulfillment device 216 may receive or obtain a container and enable fulfillment of the container by a pharmacist or pharmacy technician. In some implementations, the manual fulfillment device 216 provides the filled container to another device in the pharmacy fulfillment devices 112 to be joined with other containers in a prescription order for a user or member.

In general, manual fulfillment may include operations at least partially performed by a pharmacist or a pharmacy technician. For example, a person may retrieve a supply of the prescribed drug, may make an observation, may count out a prescribed quantity of drugs and place them into a prescription container, etc. Some portions of the manual fulfillment process may be automated by use of a machine. For example, counting of capsules, tablets, or pills may be at least partially automated (such as through use of a pill counter). Prescription drugs dispensed by the manual fulfillment device 216 may be packaged individually or collectively for shipping, or may be shipped in combination with other prescription drugs dispensed by other devices in the high-volume fulfillment center.

The review device 218 may process prescription containers to be reviewed by a pharmacist for proper pill count, exception handling, prescription verification, etc. Fulfilled prescriptions may be manually reviewed and/or verified by a pharmacist, as may be required by state or local law. A pharmacist or other licensed pharmacy person who may dispense certain drugs in compliance with local and/or other laws may operate the review device 218 and visually inspect a prescription container that has been filled with a prescription drug. The pharmacist may review, verify, and/or evaluate drug quantity, drug strength, and/or drug interaction concerns, or otherwise perform pharmacist services. The pharmacist may also handle containers which have been flagged as an exception, such as containers with unreadable labels, containers for which the associated prescription order has been canceled, containers with defects, etc. In an example, the manual review can be performed at a manual review station.

The imaging device 220 may image containers once they have been filled with pharmaceuticals. The imaging device 220 may measure a fill height of the pharmaceuticals in the container based on the obtained image to determine if the container is filled to the correct height given the type of pharmaceutical and the number of pills in the prescription. Images of the pills in the container may also be obtained to detect the size of the pills themselves and markings thereon. The images may be transmitted to the order processing device 114 and/or stored in the storage device 110 as part of the order data 118.

The cap device 222 may be used to cap or otherwise seal a prescription container. In some implementations, the cap device 222 may secure a prescription container with a type of cap in accordance with a user preference (e.g., a preference regarding child resistance, etc.), a plan sponsor preference, a prescriber preference, etc. The cap device 222 may also etch a message into the cap, although this process may be performed by a subsequent device in the high-volume fulfillment center.

The accumulation device 224 accumulates various containers of prescription drugs in a prescription order. The accumulation device 224 may accumulate prescription containers from various devices or areas of the pharmacy. For example, the accumulation device 224 may accumulate prescription containers from the unit of use device 212, the automated dispensing device 214, the manual fulfillment device 216, and the review device 218. The accumulation device 224 may be used to group the prescription containers prior to shipment to the member.

The literature device 228 prints, or otherwise generates, literature to include with each prescription drug order. The literature may be printed on multiple sheets of substrates, such as paper, coated paper, printable polymers, or combinations of the above substrates. The literature printed by the literature device 228 may include information required to accompany the prescription drugs included in a prescription order, other information related to prescription drugs in the order, financial information associated with the order (for example, an invoice or an account statement), etc.

In some implementations, the literature device 228 folds or otherwise prepares the literature for inclusion with a prescription drug order (e.g., in a shipping container). In other implementations, the literature device 228 prints the literature and is separate from another device that prepares the printed literature for inclusion with a prescription order.

The packing device 226 packages the prescription order in preparation for shipping the order. The packing device 226 may box, bag, or otherwise package the fulfilled prescription order for delivery. The packing device 226 may further place inserts (e.g., literature or other papers, etc.) into the packaging received from the literature device 228. For example, bulk prescription orders may be shipped in a box, while other prescription orders may be shipped in a bag, which may be a wrap seal bag.

The packing device 226 may label the box or bag with an address and a recipient's name. The label may be printed and affixed to the bag or box, be printed directly onto the bag or box, or otherwise associated with the bag or box. The packing device 226 may sort the box or bag for mailing in an efficient manner (e.g., sort by delivery address, etc.). The packing device 226 may include ice or temperature sensitive elements for prescriptions that are to be kept within a temperature range during shipping (for example, this may be necessary in order to retain efficacy). The ultimate package may then be shipped through postal mail, through a mail order delivery service that ships via ground and/or air (e.g., UPS, FEDEX, or DHL, etc.), through a delivery service, through a locker box at a shipping site (e.g., AMAZON locker or a PO Box, etc.), or otherwise.

The unit of use packing device 230 packages a unit of use prescription order in preparation for shipping the order. The unit of use packing device 230 may include manual scanning of containers to be bagged for shipping to verify each container in the order. In an example implementation, the manual scanning may be performed at a manual scanning station. The pharmacy fulfillment device 112 may also include a mail manifest device 232 to print mailing labels used by the packing device 226 and may print shipping manifests and packing lists.

While the pharmacy fulfillment device 112 in FIG. 2 is shown to include single devices 206-232, multiple devices may be used. When multiple devices are present, the multiple devices may be of the same device type or models, or may be a different device type or model. The types of devices 206-232 shown in FIG. 2 are example devices. In other configurations of the system 100, lesser, additional, or different types of devices may be included.

Moreover, multiple devices may share processing and/or memory resources. The devices 206-232 may be located in the same area or in different locations. For example, the devices 206-232 may be located in a building or set of adjoining buildings. The devices 206-232 may be interconnected (such as by conveyors), networked, and/or otherwise in contact with one another or integrated with one another (e.g., at the high-volume fulfillment center, etc.). In addition, the functionality of a device may be split among a number of discrete devices and/or combined with other devices.

Figure 3:
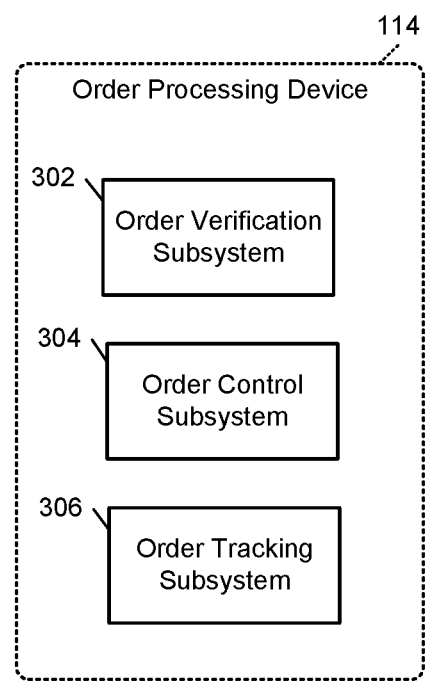
FIG. 3 is a functional block diagram of an example order processing device, which may be deployed within the system of FIG. 1.

FIG. 3 illustrates the order processing device 114 according to an example implementation. The order processing device 114 may be used by one or more operators to generate prescription orders, make routing decisions, make prescription order consolidation decisions, track literature with the system 100, and/or view order status and other order related information. For example, the prescription order may be comprised of order components.

The order processing device 114 may receive instructions to fulfill an order without operator intervention. An order component may include a prescription drug fulfilled by use of a container through the system 100. The order processing device 114 may include an order verification subsystem 302, an order control subsystem 304, and/or an order tracking subsystem 306. Other subsystems may also be included in the order processing device 114.

The order verification subsystem 302 may communicate with the benefit manager device 102 to verify the eligibility of the member and review the formulary to determine appropriate copayment, coinsurance, and deductible for the prescription drug and/or perform a DUR (drug utilization review). Other communications between the order verification subsystem 302 and the benefit manager device 102 may be performed for a variety of purposes.

The order control subsystem 304 controls various movements of the containers and/or pallets along with various filling functions during their progression through the system 100. In some implementations, the order control subsystem 304 may identify the prescribed drug in one or more than one prescription orders as capable of being fulfilled by the automated dispensing device 214. The order control subsystem 304 may determine which prescriptions are to be launched and may determine that a pallet of automated-fill containers is to be launched.

The order control subsystem 304 may determine that an automated-fill prescription of a specific pharmaceutical is to be launched and may examine a queue of orders awaiting fulfillment for other prescription orders, which will be filled with the same pharmaceutical. The order control subsystem 304 may then launch orders with similar automated-fill pharmaceutical needs together in a pallet to the automated dispensing device 214. As the devices 206-232 may be interconnected by a system of conveyors or other container movement systems, the order control subsystem 304 may control various conveyors: for example, to deliver the pallet from the loading device 208 to the manual fulfillment device 216 from the literature device 228, paperwork as needed to fill the prescription.

The order tracking subsystem 306 may track a prescription order during its progress toward fulfillment. The order tracking subsystem 306 may track, record, and/or update order history, order status, etc. The order tracking subsystem 306 may store data locally (for example, in a memory) or as a portion of the order data 118 stored in the storage device 110.

Locking Cap

FIG. 4 is a graphical representation of a side view of a container 400 including a cap 404 capable of being locked and unlocked. The container 400 defines a cavity 408 capable of storing a prescription, such as pills or another form of prescribed medical equipment (for example, patches, syringes, etc.). The cap 404 includes a cap control module 412 configured to control access to the contents of the container 400.

FIG. 5A is an expanded side view of the cap 404 of FIG. 4 in a locked state. As an example only, FIG. 5A depicts the cap 404 having square threads 420 and the container 400 having tapered threads 424. The threads 420 and 424 engage as the cap 404 is screwed onto the container 400.

The cap 404 includes two portions: an inside portion 444 positioned inside the cavity 408 of the container 400 when the cap 404 is secured on the container 400 and an outside portion 448 remaining outside the container 400. The outside portion 448 surrounds a circumference of the container 400. The cap 404 includes a solenoid 428 as a locking mechanism. The solenoid 428 includes a plunger 432 and a spring 436. The spring 436 presses the plunger 432 outward from the solenoid 428. In the locked position, the spring 436 is extended and an end 440 of the plunger 432 rests in a pocket 452 (shown in FIG. 5B) defined by the outside portion 448 of the cap 404; the plunger 432 extends through an aperture 454 (shown in FIG. 5B) of the container 400, preventing rotation of the cap 404—with respect to the container 400.

The cap control module 412 is connected to the solenoid 428 via a cable 456 through a port 460, which may be a hermetic seal including a terminal for the cable 456 to connect to a winding (not shown) of the solenoid 428. The cap control module 412 includes a battery that is selectively connected to the cable 456. When current is not passing through the cable 456, the spring 436 remains extended and the plunger 432 rests in the pocket 452, locking the cap 404 on the container 400.

FIG. 5B is an expanded side view of the cap of FIG. 4 in an unlocked state. When the cap control module 412 applies a current to the solenoid 428, an electromagnetic field is created and the plunger 432 is pulled into the solenoid 428, compressing the spring 436. The plunger 432 slides out of the pocket 452 and the aperture 454.

In various implementations, the solenoid 428 may be configured so that the plunger 432 will not extend until the cap 404 is secured on the container 400—otherwise, the plunger 432 may prevent the cap 404 from being secured back on the container 400. In various implementations, the cap 404 may include a sensor that detects fastening of the cap 404 to the container 400 and maintains power to the solenoid 428 until fastening is detected.

Control

Figure 6B:
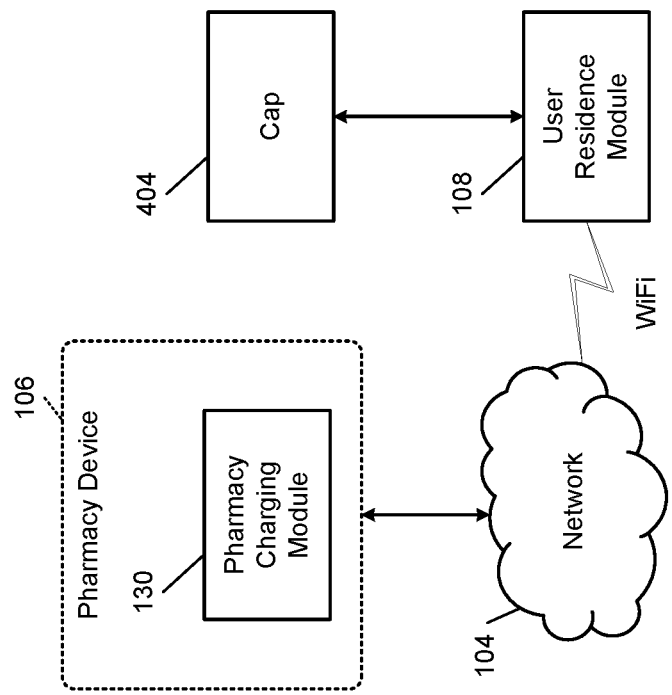
FIG. 6B is a functional block diagram of an example implementation of a cap charging system located at a user's residence.
Figure 6A:
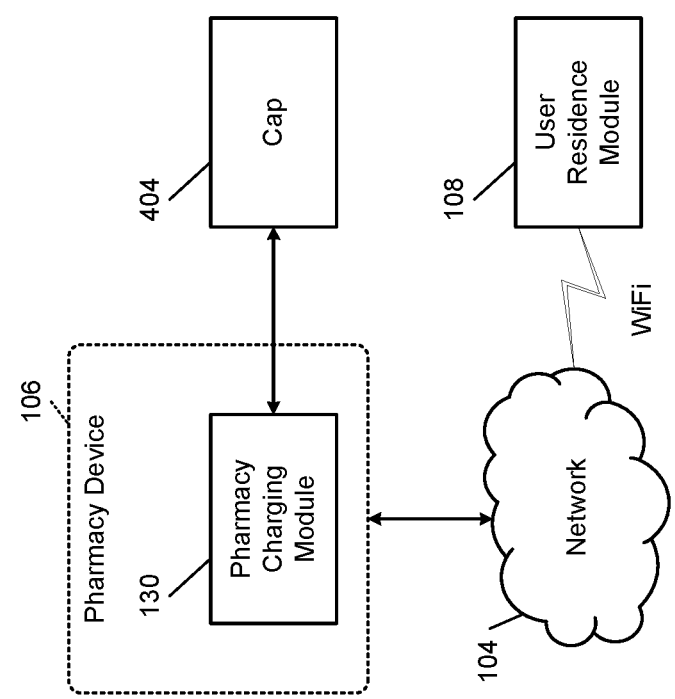
FIG. 6A is a functional block diagram of an example implementation of a cap charging system located at a pharmacy.

FIG. 6A is a functional block diagram of an example implementation of a cap charging system located at a pharmacy. As mentioned above, the pharmacy device 106 includes the pharmacy charging module 130. The pharmacy device 106 applies a unique prescription identifier (RX ID) to each cap. For example, each cap may be programmed with prescription information and instructions corresponding to the relevant user and relevant prescription prior to being capped on the corresponding container. The cap 404 is charged before and/or after having the corresponding RX ID is applied.

The pharmacy charging module 130 charges a battery (or other charge storage device) of the cap 404. In various implementations, the pharmacy charging module 130 charges the battery via a wired charging method, such as via metal contacts. For example, the pharmacy charging module 130 may charge the cap 404 to a level or a voltage that is proportional to the amount of time the prescription associated with the cap 404 should be administered. For instance, the pharmacy charging module 130 may receive a control signal indicating the amount to charge the cap 404 according to the prescription orders directed by the order processing device 114. If the prescription associated with the cap 404 is intended to be administered for one week, the pharmacy charging module 130 will charge the cap 404 to last for one week.

In various implementations, the pharmacy device 106 may alter the level of charge of the cap 404 based on an estimated delivery date of the container to which the cap 404 will be affixed. That is, if delivery of the container will last three days, the pharmacy charging module 130 may charge the cap 404 to last the additional three days.

FIG. 6B is a functional block diagram of an example implementation of a cap charging system located at a user's residence. Once the container is delivered to the user's residence, the cap 404 can connect to the user residence module 108, such as via a Bluetooth connection. Alternatively, near field communication may be implemented for communication between the cap 404 and the user residence module 108.

In various implementations, the user residence module 108 charges the cap 404 to the level of charge needed to maintain access for the duration of the prescription. The user residence module 108 may connect to the pharmacy device 106 via the network 104 using a WiFi connection. The user residence module 108 may receive regimen instructions from the pharmacy device 106 using the RX ID stored in the cap 404. In this way, the user residence module 108 can determine the desired level of charge of the cap 404 according to the regimen instructions received from the pharmacy device 106. Similar to the pharmacy charging module 130, the user residence module 108 may also charge the cap 404 via a wired or wireless charging method.

Figure 7:
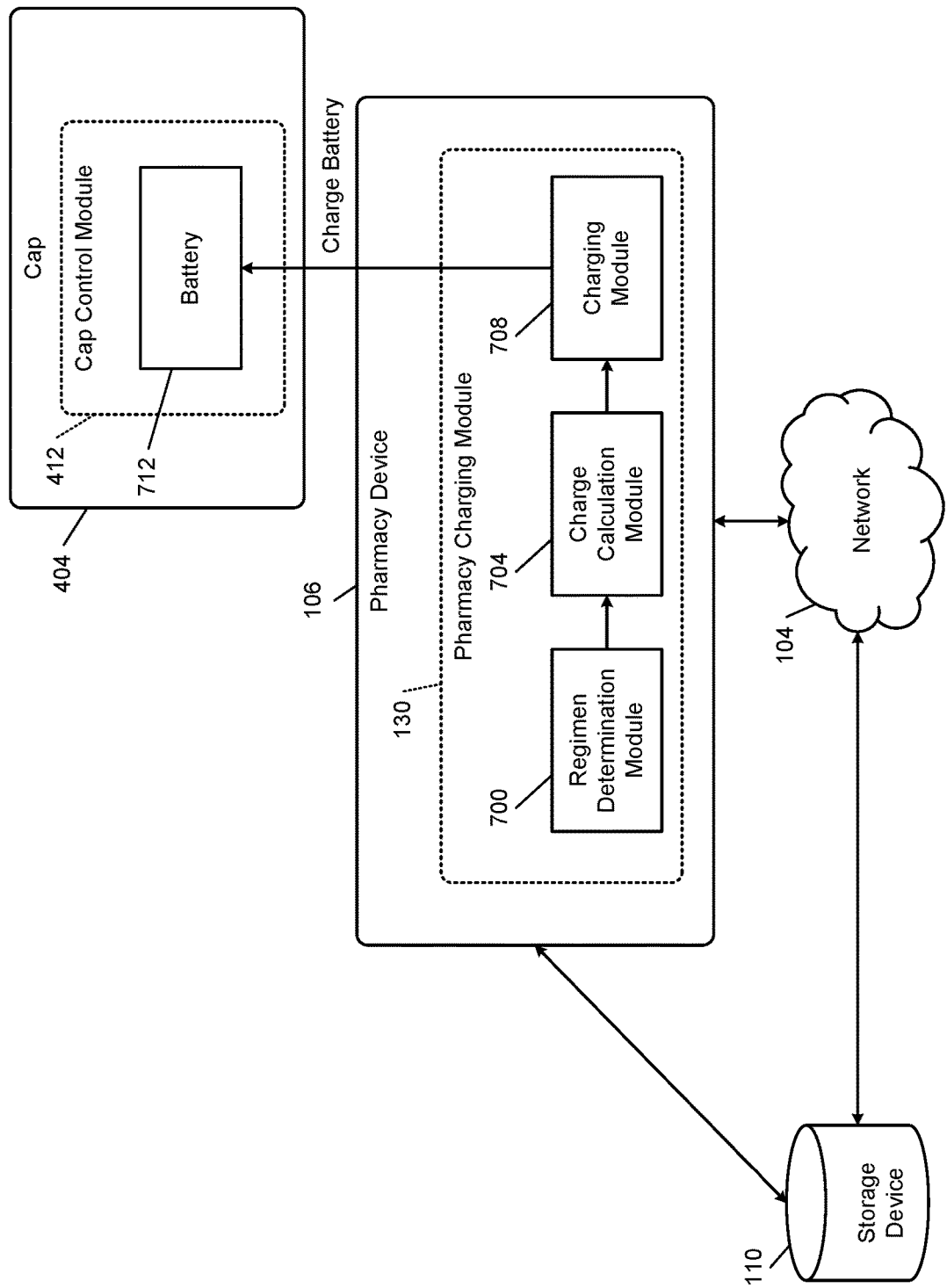
FIG. 7 is a functional block diagram of an example implementation of a pharmacy device charging system.

FIG. 7 is a functional block diagram of an example implementation of a charging system of the pharmacy device 106. In various implementations, the pharmacy charging module 130 includes a regimen determination module 700, a charge calculation module 704, and a charging module 708. The pharmacy charging module 130 can receive regimen instructions for the container from the storage device 110 via the network 104. Alternatively, the pharmacy charging module 130 can receive regimen instructions from the order processing device 114, as mentioned above. The regimen determination module 700 is configured to determine the frequency, number, days, times, and prescription course of the prescription.

The charge calculation module 704 calculates the level of charge of a battery 712 of the cap control module 412 based on the regimen instructions. That is, once the regimen determination module 700 receives the regimen instructions and determines the prescription course—for example, the number of days the user should be administered the prescription—the charge calculation module 704 can determine the level of charge that is adequate for the battery 712 to last the prescription course. In some implementations, the charge calculation module 704 may also consider transit information (received from the storage device 110) to adjust the level of charge of the battery 712. For example, the storage device 110 may include delivery information of the user associated with the regimen instructions. If the transit time from the prescription filling location to the user is three days, the charging module 708 can adjust the desired level of charge to account for the three-day transit time and charge the battery 712 accordingly.

Figure 8A:
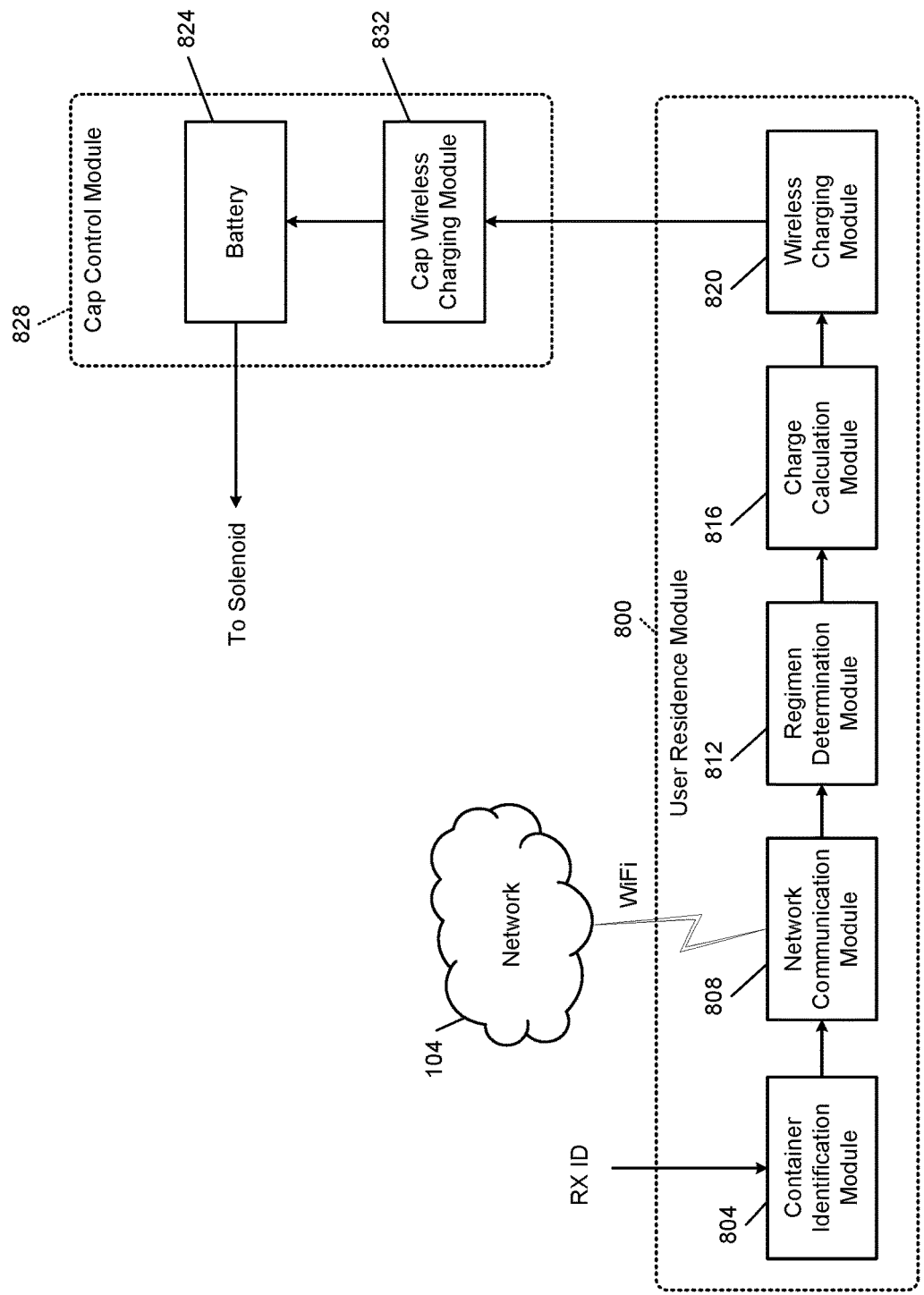
FIG. 8A is a functional block diagram of an example implementation of a cap charging system including a user residence module.

FIG. 8A is a functional block diagram of an example implementation of a cap charging system including a user residence module 800. The user residence module 800 includes a container identification module 804, a network communication module 808, a regimen determination module 812, a charge calculation module 816, and a wireless charging module 820. In various implementations, the container identification module 804 includes a scanner capable of scanning a barcode on a prescription container. The barcode on the container encodes an RX ID identifying the container. The network communication module 808 can communicate via WiFi with the network 104 to access regimen instructions corresponding to the RX ID of the container.

For example, the network communication module 808 can retrieve information through the network 104 to determine whether the user residence module 800 should charge the cap an additional amount. More specifically, the regimen determination module 812 can receive regimen instructions from the network 104, such as the prescription course, which corresponds to the length of time or number of days the user should be administered the prescription, the level of charge of a battery 824, etc. Based on the regimen instructions, the charge calculation module 816 can calculate if the wireless charging module 820 should charge the battery 824 of a cap control module 828 via a cap wireless charging module 832.

For example, if the regimen determination module 812 determines that the regimen instructions have been updated, the regimen determination module 812 can identify updated regimen instructions. Then, the charge calculation module 816 can calculate a desired charge level based on the updated regimen instructions. In other implementations, the pharmacy device 106 may directly supply a number describing the desired charge level to the user residence module 800. A present charge level of the battery 824 is compared to the desired charge level. If additional charge is needed, the charge calculation module 816 calculates the additional charge needed. That is, the charge calculation module 816 calculates the additional charge needed for the battery 824 to last the prescription course based on the updated regimen instructions. Once the charge calculation module 816 calculates the additional amount, the wireless charging module 820 can charge the battery 824 via the cap wireless charging module 832 for a time corresponding to the additional amount. Alternatively, the battery 824 can be charged until closed-loop control determines that the present charge level equals the desired charge level.

The user residence module 800 can also account for delays in receipt of the container. As described above, transit time can prompt the user residence module 800 or the pharmacy charging module 130 to charge the cap by an additional amount. A delay in the user picking up the prescription can prompt the user residence module 800 to account for the pickup delay. For example, if the user retrieves the container two days after the prescription is available for pickup, the user residence module 800 can identify the potential charging discrepancy based on regimen instructions stored in the pharmacy device 106. The user residence module 800 may then provide additional charge to the cap control module 828.

Figure 8B:
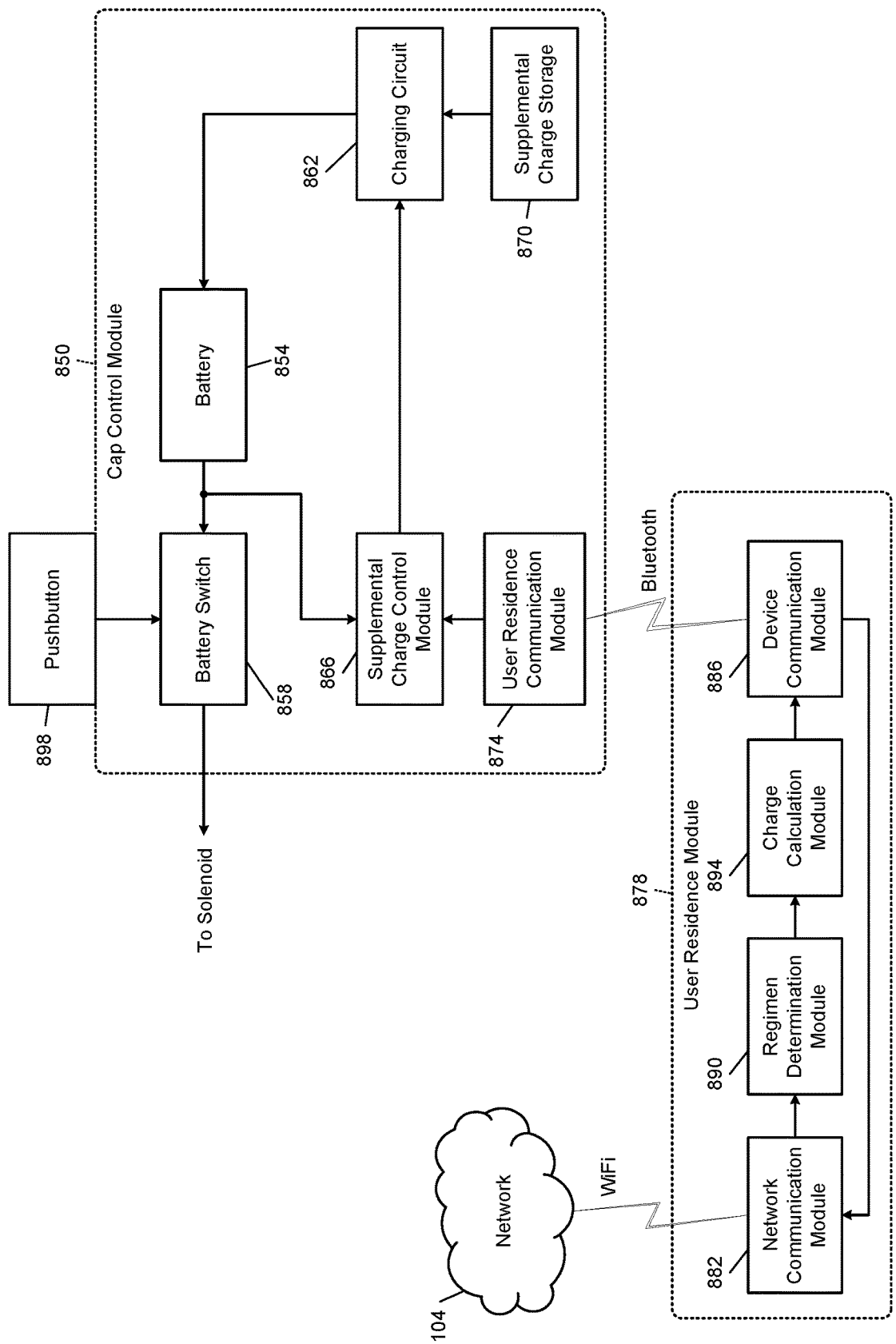
FIG. 8B is a functional block diagram of an example implementation of a charging system integrated with a cap.

FIG. 8B is a functional block diagram of an example implementation of a charging system integrated with the cap. In various implementations, a cap control module 850 of the cap includes a charging system within the cap in lieu of the wireless charging module 820 of FIG. 8A.

The cap control module 850 includes a battery 854, a battery switch 858, a charging circuit 862, supplemental charge control module 866, supplemental charge storage 870, and a user residence communication module 874. The user residence communication module 874 communicates, such as via Bluetooth, with a user residence module 878. The user residence module 878 can include a network communication module 882 that communicates with the pharmacy device and storage device via the network 104 using a WiFi connection.

The network communication module 882 can retrieve information corresponding to the prescription stored in the container and associated with the cap. For example, an RX ID can be stored in the cap control module 850 to identify the prescription contained in the container. The user residence module 878 includes a device communication module 886 that communicates with the user residence communication module 874, such as via a Bluetooth connection, to determine the RX ID of the cap control module 850. Based on the RX ID received from the cap control module 850, the network communication module 882 can retrieve information corresponding to the RX ID from the pharmacy device 106 and the storage device 110.

A regimen determination module 890 receives regimen instructions from the pharmacy device 106 and identifies the regimen instructions that relate to prescription access. For example, as described with respect to FIG. 8A, the regimen determination module 890 can retrieve a variety of information including prescription course, the amount of charge received at the pharmacy, expiration information, etc. A charge calculation module 894 calculates whether the cap should receive an additional amount of charge. For example, if the container contains a certain prescription that the user was prescribed to be administered twice per day and the pharmacy has updated the regimen instructions to administer the prescription once per day, the user residence module 878 retrieves the updated regimen instructions via the network 104 and may determine that a longer access time is necessary. The charge calculation module 894 determines whether the battery 854 should receive additional charge and, if so, the device communication module 886 sends a charge signal to the user residence communication module 874 indicating the battery 854 should be charged the additional amount.

Once the supplemental charge control module 866 receives the signal to add charge to the battery 854 from the user residence module 878, the supplemental charge control module 866 controls the charging circuit 862 to connect the supplemental charge storage 870 to the battery 854. The supplemental charge control module 866 actuates the charging circuit 862 for a time that corresponds to the additional amount of charge.

To unlock the container, the battery switch 858 connects the battery 854 to the solenoid, sliding the plunger from the aperture, allowing a user to rotate the cap. In various implementations, the battery switch 858 remains in an open position until a pushbutton 898 is actuated. The pushbutton 898 is mounted on the cap and coupled to the cap control module 850. A user can press the pushbutton 898 to close the battery switch 858, connecting the battery 854 to the solenoid. That is, once the pushbutton 898 is actuated, the plunger slides out of the aperture, allowing the user to twist or otherwise remove the cap from the container. In various implementations, the pushbutton 898 may remain closed for a period of time (such as 60 seconds) to allow removal of drugs and replacement of the cap.

Figure 8C:
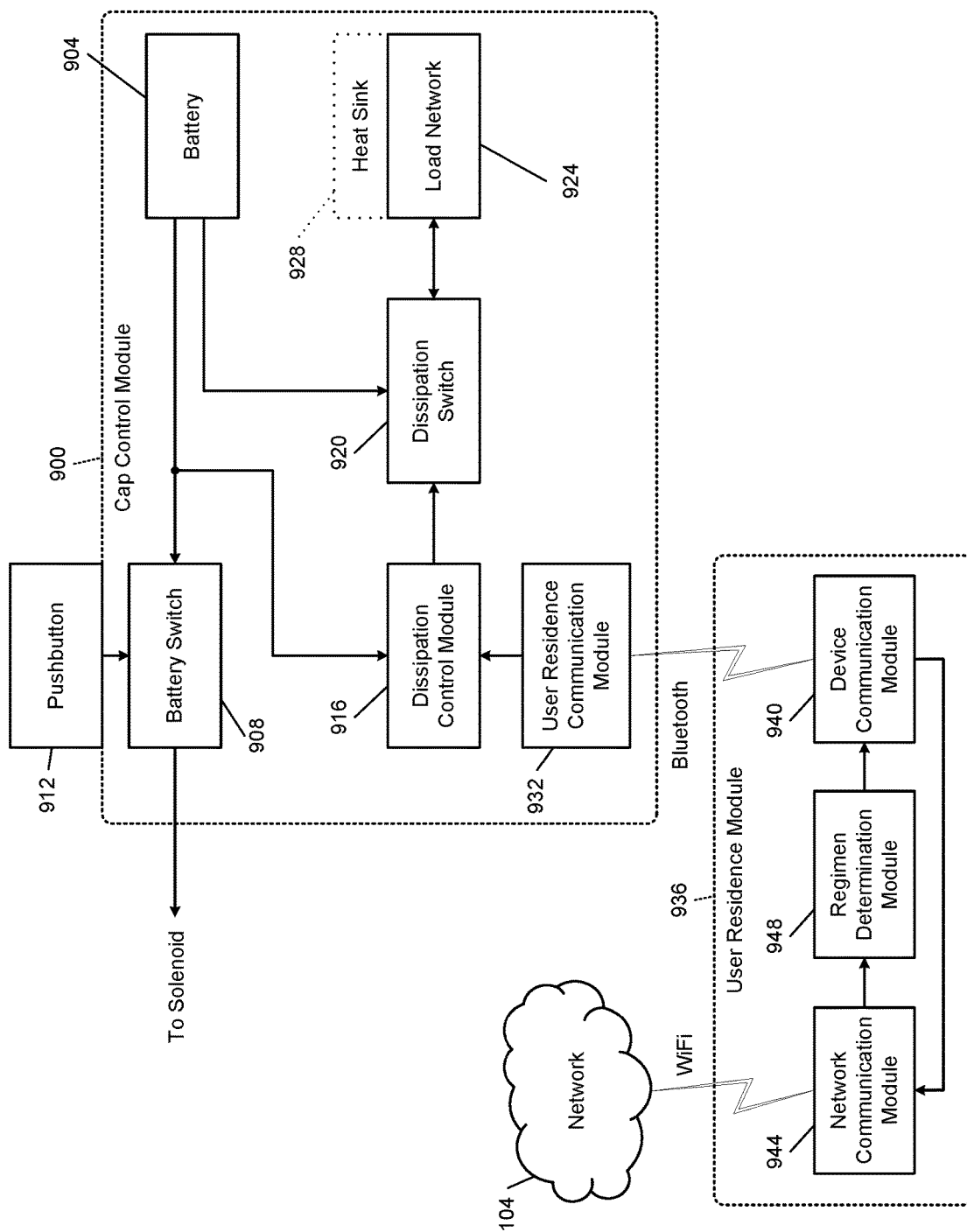
FIG. 8C is a functional block diagram of an example implementation of a battery discharge system in a cap.

FIG. 8C is a functional block diagram of an example implementation of a battery discharge system in the cap. In various implementations, a cap control module 900 includes an onboard system that discharges a battery 904 of the cap control module 900. The cap control module 900 can also include a battery switch 908, similar to the battery switch 858 of FIG. 8B, selectively connecting the battery 904 to the solenoid in response to actuation of a pushbutton 912.

The cap control module 900 can further include a dissipation control module 916, a dissipation switch 920, a load network 924, an optional heat sink 928, and a user residence communication module 932. The user residence communication module 932 communicates with a user residence module 936—specifically, a device communication module 940 of the user residence module 936, such as via a Bluetooth connection—to determine if the dissipation control module 916 should drain a remaining charge of the battery 904.

The user residence module 936 includes a network communication module 944 and a regimen determination module 948. The device communication module 940 receives the RX ID of the cap. The network communication module 944 retrieves regimen instructions that correspond to the RX ID of the cap. The regimen determination module 948 identifies if the prescription course has expired. That is, if the regimen instructions for the RX ID indicated the prescription should be administered over the course of ten days, on the eleventh day the regimen determination module 948 can determine that the prescription contained in the container should no longer be administered.

In a circumstance where a prescription is recalled, the pharmacy can update the regimen instructions for the recalled prescription. When the regimen determination module 948 receives the updated regimen instructions, the regimen determination module 948 can determine that the prescription of the container should no longer be administered and the battery 904 should be discharged.

If the prescription course has expired, or any circumstance occurs where the user should no longer be administered the prescription, the regimen determination module 948 can send a dissipation signal via the device communication module 940 to the cap control module 900. In response to the dissipation signal, the dissipation control module 916 actuates the dissipation switch 920 to connect the battery 904 to the load network 924. The load network 924 is configured to drain the battery 904. In various implementations, the load network 924 includes a bank of resistors connected in parallel. The heat sink 928 is thermally coupled to the load network 924 to absorb excessive heating of the load network 924. Once the battery 904 is drained, the cap control module 900 can no longer apply current to the solenoid 428, and the cap will remain in the locked position.

Figure 8D:
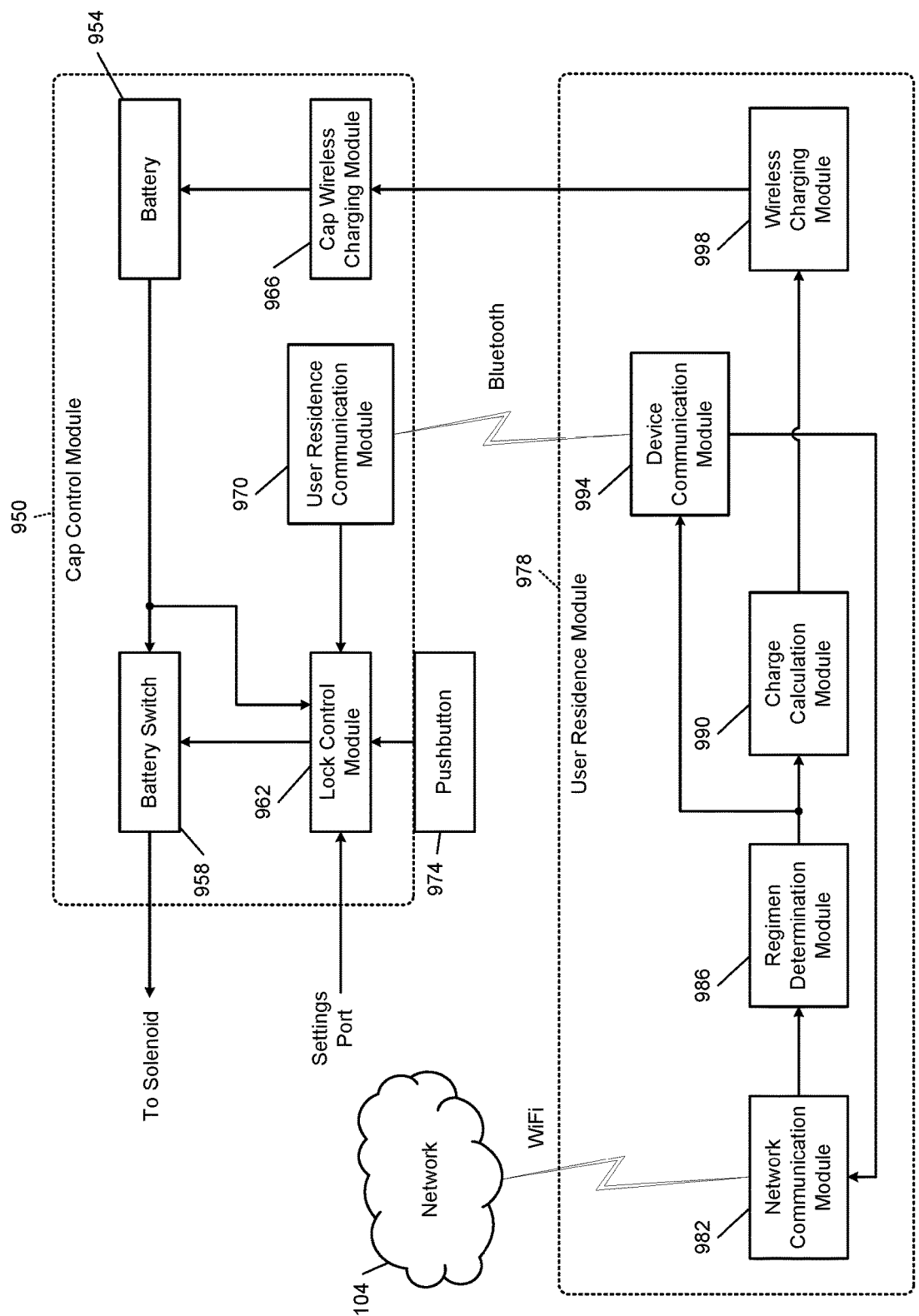
FIG. 8D is a functional block diagram of an example implementation of a regimen adherence system.

FIG. 8D is a functional block diagram of an example implementation of a regimen adherence system. A cap control module 950 includes a battery 954, a battery switch 958, a lock control module 962, a cap wireless charging module 966, and a user residence communication module 970. A pushbutton 974 is coupled to the cap control module 950.

A user residence module 978 includes a network communication module 982, a regimen determination module 986, a charge calculation module 990, a device communication module 994, and a wireless charging module 998. Similarly to the above, the network communication module 982 retrieves regimen instructions via the network 104 from the pharmacy device 106 and the storage device 110. The regimen determination module 986 identifies relevant regimen instructions, such as the prescription course, days of the week the prescription should be administered, etc. Based on the regimen instructions, the charge calculation module 990 determines if the wireless charging module 998 should wirelessly charge the battery 954 of the cap control module 950.

For example, the charge calculation module 990 can charge the battery 954 as long as the prescription course has not expired. The charge calculation module 990 may determine the starting charge level the battery 954 received at the pharmacy and determine if additional charge is necessary based on the regimen instructions. For example, if, since the container was shipped, the prescription course includes additional days for prescription administration, the wireless charging module 998 can charge the battery 954 the additional amount that the charge calculation module 990 calculates. Additionally, the charge calculation module 990 can consider a shipment time of the prescription and charge the battery 954 in response to the shipment time being extended.

The charge calculation module 990 sends a charge signal to the wireless charging module 998 to charge the battery 954 via the cap wireless charging module 966 for a time corresponding to the calculated additional amount to charge the battery 954. The device communication module 994 communicates regimen instructions to the cap control module 950 via the user residence communication module 970. The lock control module 962 closes the battery switch 958 based on actuation of the pushbutton 974 and the regimen instructions. For example, if a user has actuated the pushbutton 974 to remove the cap from the container, the lock control module 962 determines whether the user should be administered the prescription. That is, the lock control module 962 compares the regimen instructions with the current date and time to determine if the user should be administered the prescription.

The lock control module 962 can also include a settings port: for example, a bank of one-time field programmable fuses. In this way, the pharmacy can set the RXID, which cannot be altered after leaving the pharmacy, and perhaps also requirements of the lock control module 962 for the user to access the prescription.

If the lock control module 962 determines that the user should be administered the prescription, the lock control module 962 sends a connect signal to connect the battery switch 958 and provide power from the battery 954 to the solenoid. As long as the battery 954 has enough charge, the power provided to the solenoid will slide the plunger into the solenoid, removing the plunger from the aperture. Once the plunger is removed, the user can remove the cap from the container to access the prescription.

Figure 9:
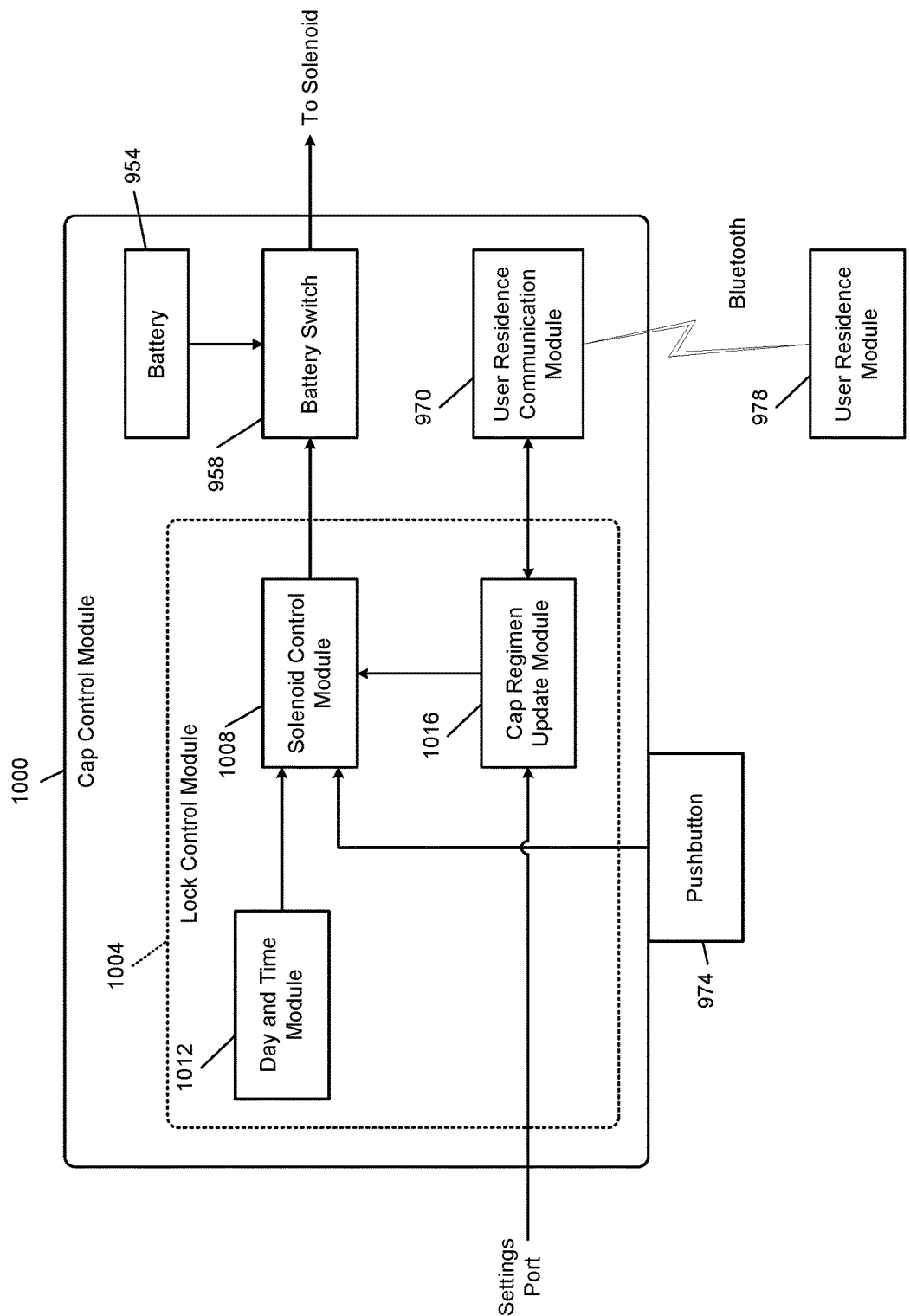
FIG. 9 is a functional block diagram of an example implementation of a lock control module of a cap.

FIG. 9 is a functional block diagram of an example implementation of a cap control module 1000. A lock control module 1004 includes a solenoid control module 1008, a day and time module 1012, and a cap regimen update module 1016. The solenoid control module 1008 actuates the battery switch 958 in response to the programmed parameters being satisfied. The solenoid control module 1008 receives day and time data from the day and time module 1012, regimen instructions from the cap regimen update module 1016, and an actuation signal from the pushbutton 974.

Based on the updated or most-recently-received regimen instructions (as retrieved from the user residence module 978), the solenoid control module 1008 determines if the current day and time satisfy the parameters of the regimen instructions. If the day and time requirements are met and the pushbutton 974 has been actuated, the solenoid control module 1008 actuates the battery switch 958. Otherwise, the plunger remains secured in the aperture, preventing the user from removing the cap from the container.

A settings port can set parameters for the lock control module 1004, including the RX ID and the regimen instructions to the cap regimen update module 1016. The cap regimen update module 1016 may use a pre-programmed public key to authenticate updates from the pharmacy device that are signed with the corresponding private key.

Flowcharts

Figure 10:
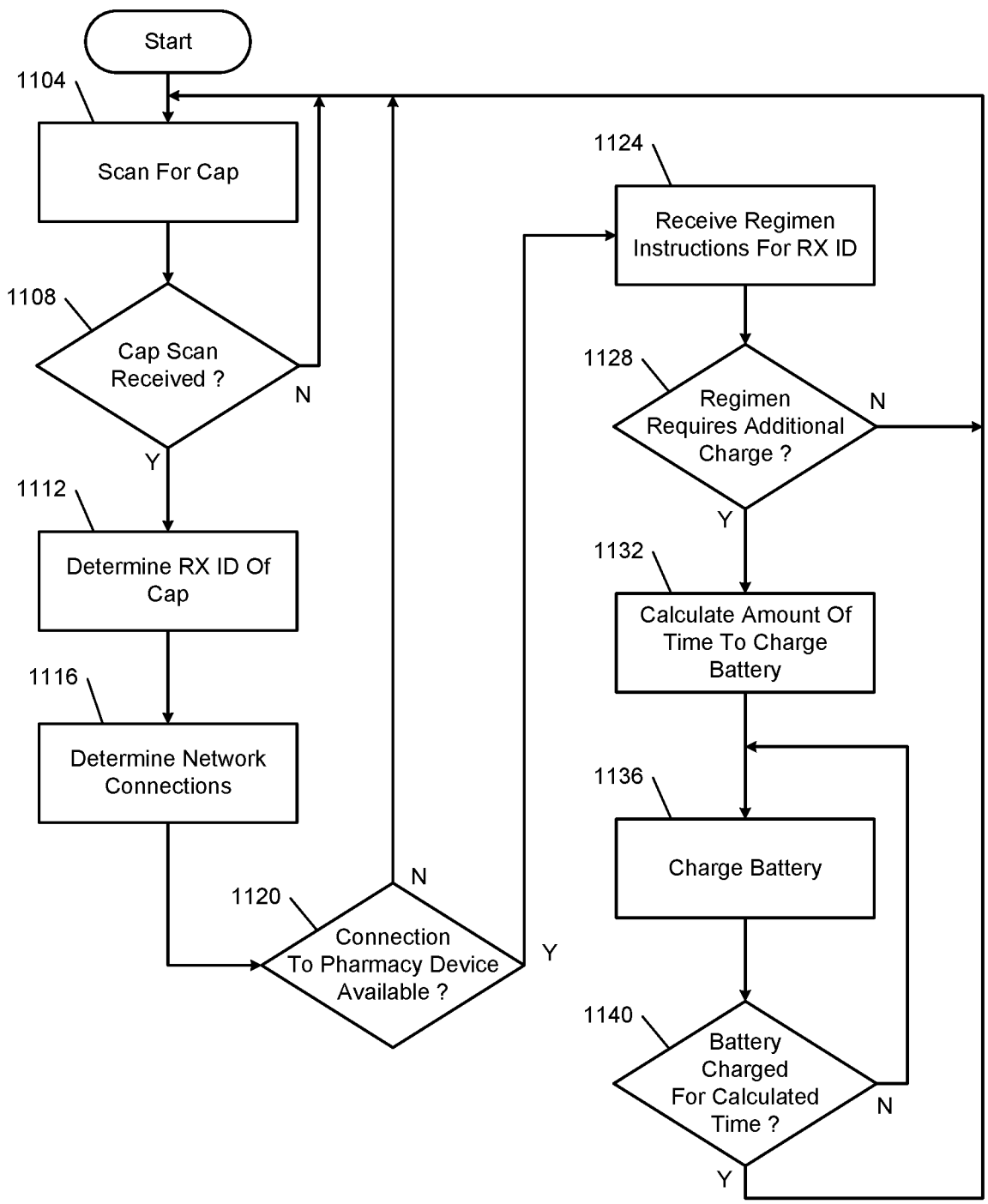
FIG. 10 is a flowchart of example cap recharging according to the cap charging system of FIG. 8A.

FIG. 10 is a flowchart of example cap recharging, such as may be performed by the cap charging system of FIG. 8A. At 1104, the container identification module scans for the container. If the container scan is not received at 1108, control returns to 1104 until the scan is received. If the container scan is received at 1108, control continues to 1112 to determine the RX ID of the container. At 1112, control determines the RX ID of the container from the container scan—for example, from a barcode of the container. At 1116, the user residence module determines network connections. That is, the network communication module of the user residence module determines whether a WiFi connection is available to the network and whether information can be retrieved from the pharmacy device and the storage device.

At 1120, if a connection to the pharmacy device via the network is available, control continues to 1124; otherwise, control returns to 1104 to wait for a container to be scanned. At 1124, control receives regimen instructions for the RX ID of the container. That is, control identifies regimen instructions for the RX ID to receive the most recent regimen instructions for the RX ID.

At 1128, control determines whether the container should be charged based on the regimen instructions. For example, if the prescription course of the RX ID has been extended or other information from the pharmacy device indicates a delay in the user being administered the prescription, the battery of the cap should be additionally charged so the user can remove the cap from the container over a longer time frame. If the charge calculation module determines that no additional charge is appropriate, control returns to 1104 to wait for a container to be scanned.

If the charge calculation module determines additional charge is appropriate at 1128, control continues to 1132 where the charge calculation module calculates how much to charge the battery. For example, the charge calculation module can determine that the user should have access to the prescription for an additional two days due to the prescription being delivered late. Therefore, at 1136 control will charge the battery to store an additional two days of charge. More specifically, the battery will be charged for a calculated time to account for the additional two days. At 1140, control determines whether the battery 824 has been charged for the calculated time. Control charges the battery at 1136 until the calculated time is satisfied and returns to 1104.

Figure 11:
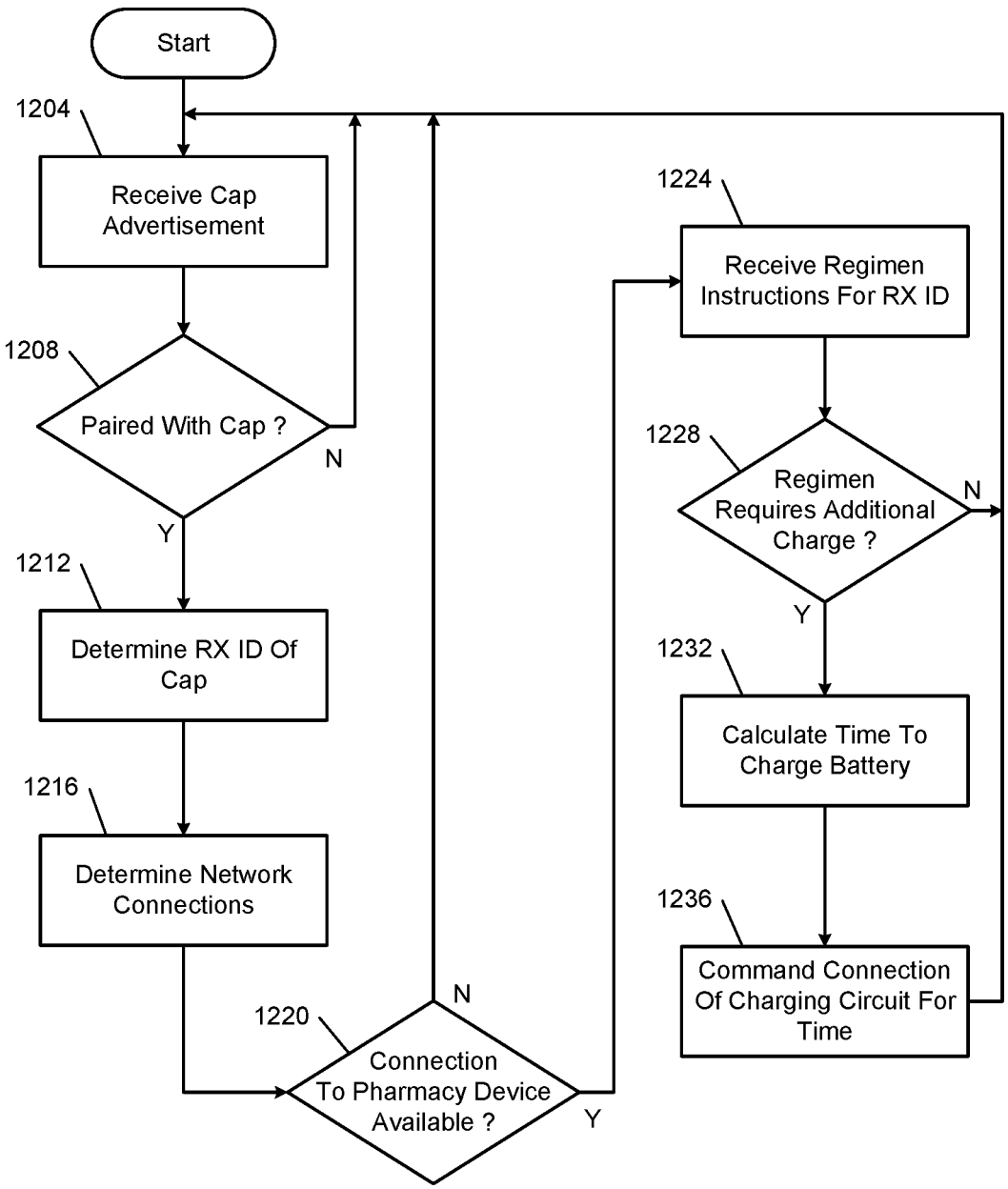
FIG. 11 is a flowchart of example cap charging according to the charging system onboard the cap of FIG. 8B.

FIG. 11 is a flowchart of example cap charging, such as by the charging system of FIG. 8B. At 1204, the user residence module receives a cap advertisement from the cap. For example, the cap may be advertised via the user residence communication module. The cap and the user residence module communicate via a Bluetooth connection. At 1208, the user residence module determines whether it is paired with the cap. If not, control returns to 1204 to wait to receive a cap advertisement.

Once the cap is paired with the user residence module, control continues to 1212 to determine the RX ID of the cap. At the pharmacy, the cap is labeled with a unique RX ID that identifies which prescription is associated with the cap. At 1216, control determines whether a network connection is available to the pharmacy device.

At 1220, if a connection to the pharmacy device is available, control transfers to 1224; otherwise, control returns to 1204 to wait for a cap advertisement. At 1224, control obtains regimen instructions for the RX ID of the cap from the pharmacy device. Then, at 1228, the regimen determination module determines if the regimen instructions require that the battery of the cap receive additional charge. If no, control returns to 1204. If yes, control continues to 1232 where control calculates a charge time to charge the battery. Control continues to 1236 to send a charge signal to the cap control module to command the connection of the charging circuit for the calculated time. Control then returns to 1204 to wait to receive a cap advertisement.

Figure 12:
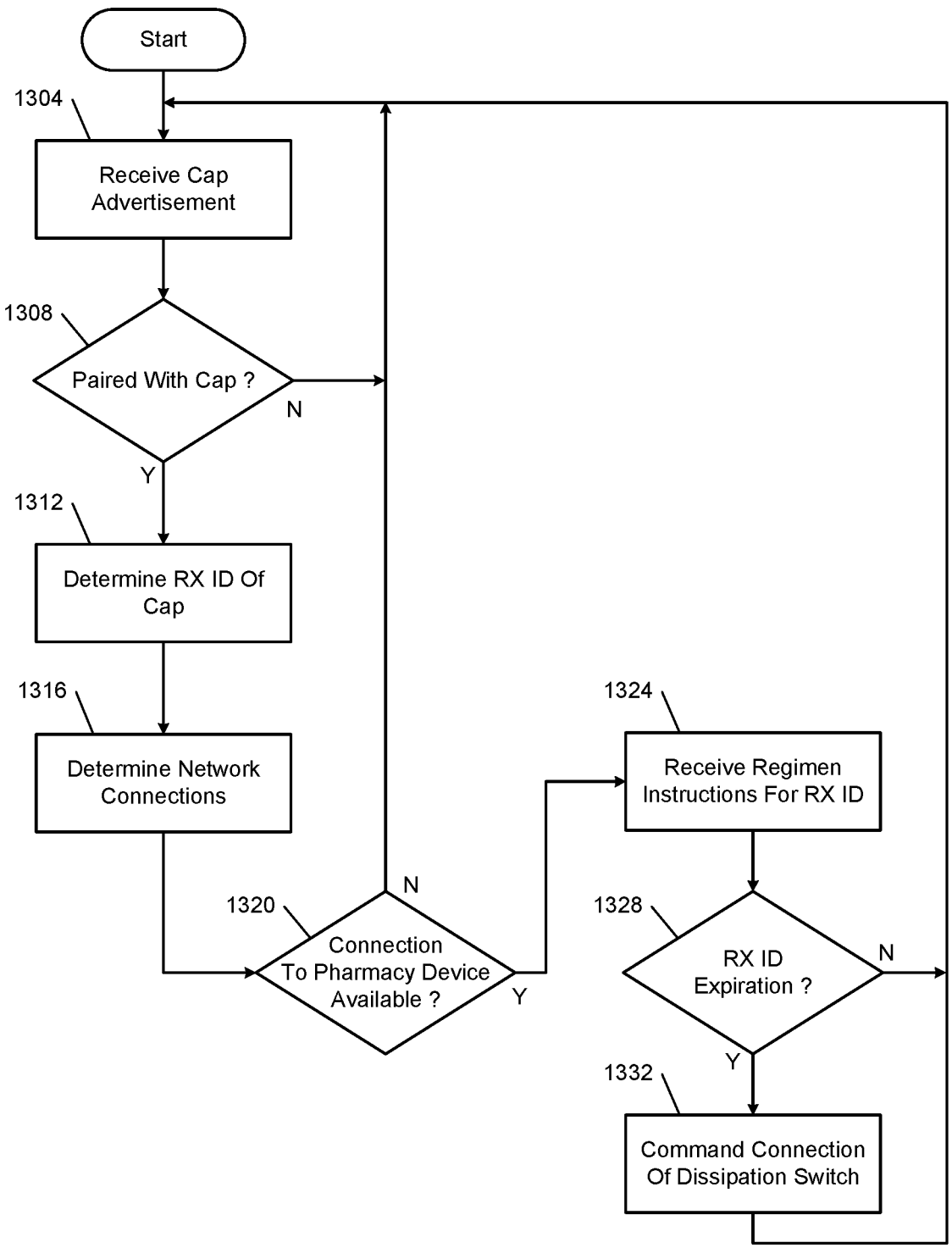
FIG. 12 is a flowchart of example cap discharging according to the discharging system of FIG. 8C.

FIG. 12 is a flowchart of example cap discharging, such as is shown in FIG. 8C. At 1304, the user residence module waits to receive a cap advertisement from the cap. At 1308, control determines whether the cap and the user residence module are paired via a Bluetooth connection between the user residence communication module and the device communication module. If the user residence module is not paired with the cap, control returns to 1304 to wait to receive a cap advertisement.

If the user residence module is paired with the cap, control continues to 1312 to determine the RX ID of the cap. Control continues to 1316 to determine if the network communication module can connect to the pharmacy device over the network. If the network communication module can connect with the pharmacy device via the network at 1320, control continues to 1324; otherwise, control returns to 1304 to wait to receive a cap advertisement.

At 1324, control receives regimen instructions corresponding to the RX ID of the cap. At 1328, if the regimen instructions indicate that the RX ID is expired or access to the prescription should be ended, control continues to 1332; otherwise, control returns to 1304 to wait to receive a cap advertisement. At 1332, control transmits a dissipation signal to the cap to command the connection of the dissipation switch to drain the battery and end access to the prescription. Control then returns to 1304 to wait for a cap advertisement.

Figure 13:
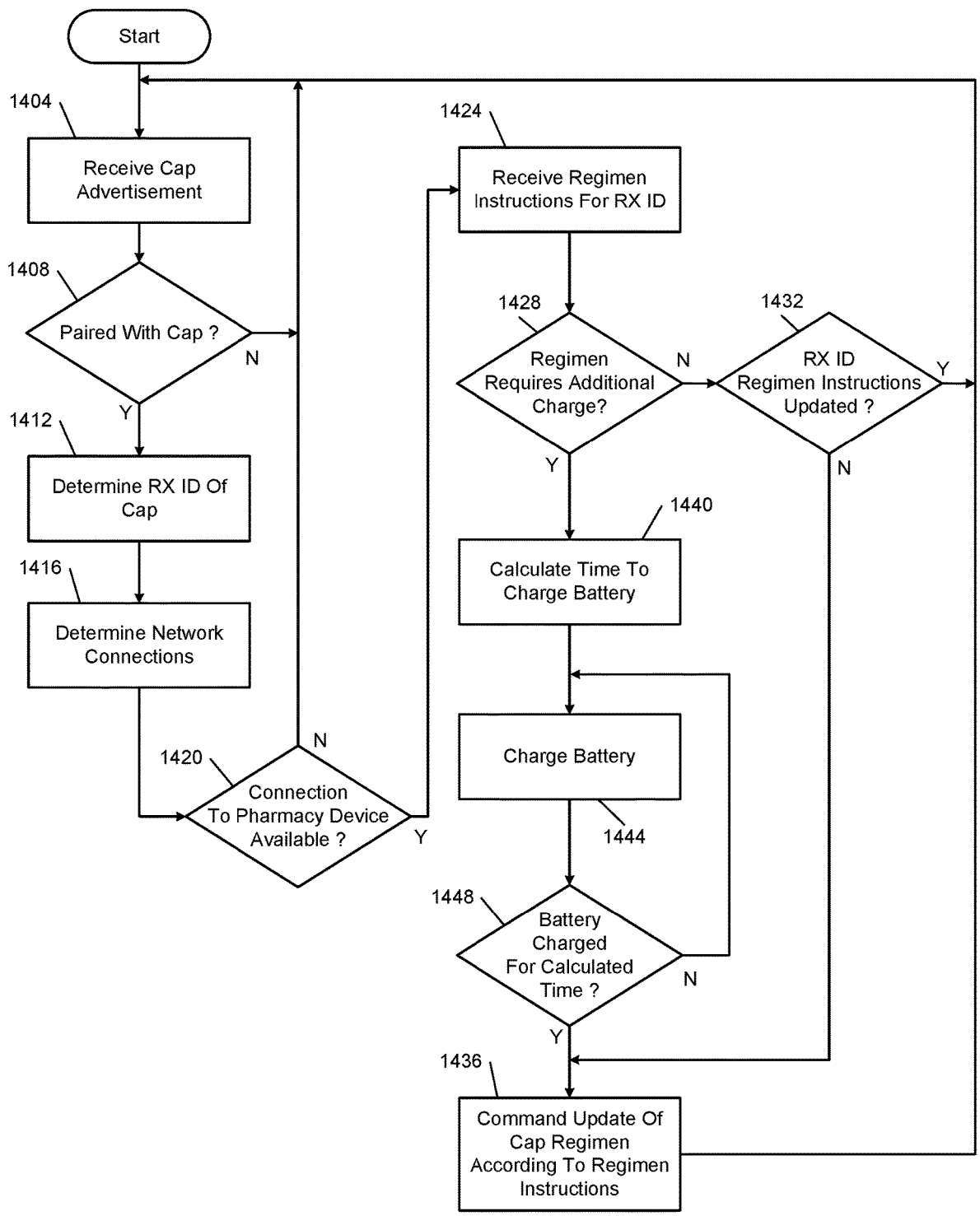
FIG. 13 is a flowchart of example cap access control based on regimen instructions according to the regimen adherence system of FIG. 8D.

FIG. 13 is a flowchart of example cap access control based on regimen instructions such as shown in FIG. 8D. At 1404, the user residence module waits to receive a cap advertisement from the cap. At 1408, control determines if the cap is paired with the user residence module via a Bluetooth connection. If no, control returns to 1404 to wait to receive a cap advertisement. If the user residence module is paired with the cap, control continues to 1412 to determine the RX ID of the cap. Control continues to 1416 to determine if the network communication module can connect to the pharmacy device over the network.

At 1420, if the network communication module can connect to the pharmacy device via the network, control continues to 1424; otherwise, control returns to 1404 to wait for a cap advertisement. At 1424, control receives regimen instructions for the RX ID of the cap from the pharmacy device.

At 1428, control determines if the regimen instructions indicate that the battery requires additional charge. If no, control continues to 1432 to determine if the regimen instructions have been updated. If regimen instructions were updated, control returns to 1404 to wait for a cap advertisement. Otherwise, control continues to 1436 to send an update signal to command update of the cap regimen with the most-recently-received regimen instructions. Control then returns to 1404 to wait to receive a cap advertisement.

Returning to 1428, if the battery should receive additional charge, control continues to 1440 to calculate a time to charge the battery. At 1444, the wireless charging module charges the battery. At 1448, control determines if the battery has been charged the calculated time. If no, control returns to 1444 to continue to charge the battery; otherwise, control continues to 1436 to update the cap regimen instructions according to the regimen instructions received from the pharmacy device. Control returns to 1404 to wait to receive a cap advertisement.

Figure 14:
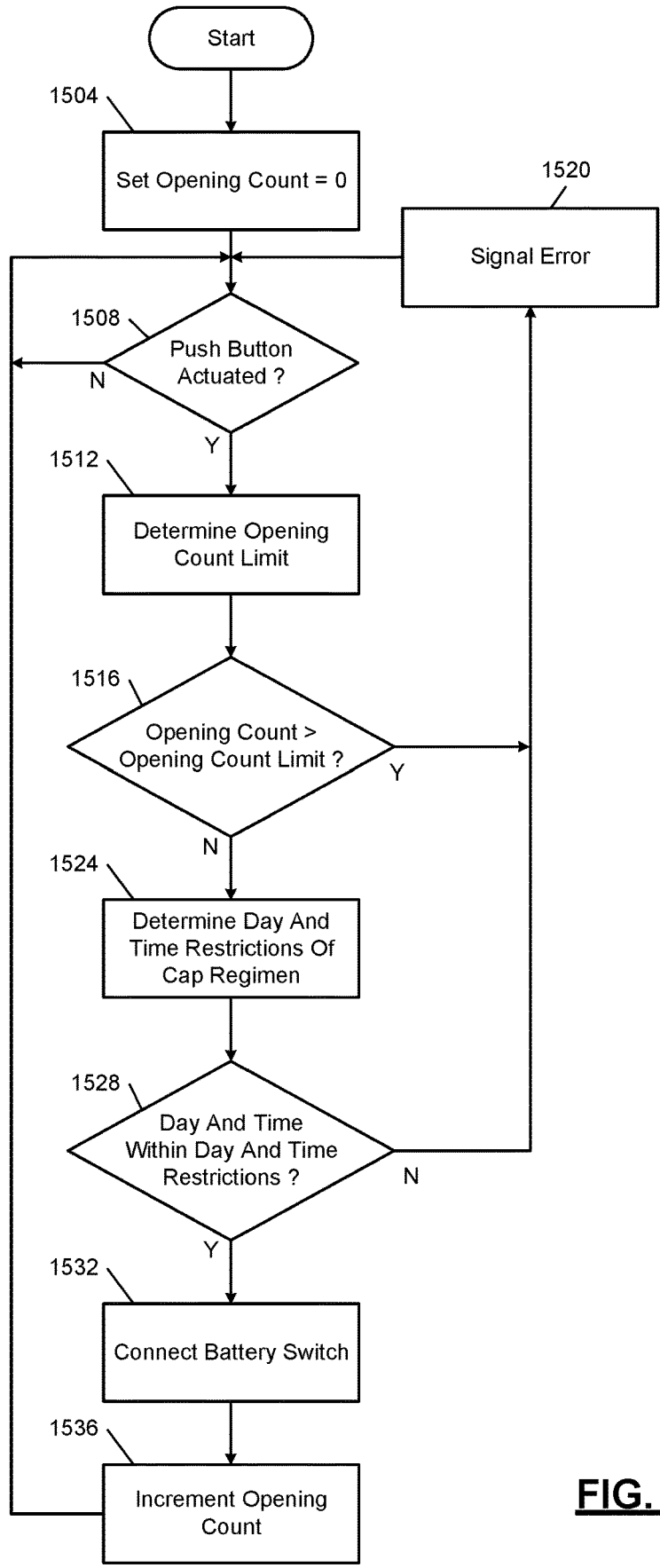
FIG. 14 is a flowchart of example cap access control according to the lock control module of FIG. 9.

FIG. 14 is a flowchart of example cap access control, which may be implemented by hardware shown in FIG. 9. At 1504, an opening count is set to zero. The opening count indicates a number of times the battery switch is connected. The number of times the battery switch is connected may correspond to the number of times the prescription is being accessed. Control is monitoring the number of times the prescription is administered to regulate prescription administration according to the regimen instructions.

Once the opening count reaches zero, control continues to 1508 to determine if the pushbutton has been actuated. If no, control waits for the pushbutton to be actuated. If yes, control continues to 1512 to determine an opening count limit based on the regimen instructions. At 1516, control determines if the opening count is greater than the opening count limit. If yes, control continues to 1520 to signal that an error has occurred. Control then waits at 1508 for the pushbutton to be actuated again. If the opening count is not greater than the opening count limit at 1516, control continues to 1524 to determine day and time restrictions according to the regimen instructions.

At 1528, the solenoid control module determines if the current day and time correspond to the day and time restrictions of the regimen instructions. If no, control continues to 1520 to signal that an error has occurred. If yes, control continues to 1532 where the solenoid control module actuates the battery switch so the cap can be removed from the container. In various implementations, the battery switch remains connected for a period, such as 60 seconds. Control continues to 1536 to increment the opening count. Control returns to 1508 to wait for the pushbutton to be actuated again.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A charge adjustment device located at a residence, the charge adjustment device comprising:
 a container identification module configured to determine a prescription identifier (RX ID) of a cap attached to a container;
 a charge determination module configured to:
  establish a connection with a remote data source over a network,
  according to the RX ID, obtain information from the remote data source over the network, and
  based on the obtained information, calculate a desired charge amount of a battery of the cap; and
 a charge control module configured to selectively control additional charge to be supplied to the battery based on the desired charge amount.

2. The charge adjustment device of claim 1 further comprising a charging module configured to provide the additional charge to the battery.

3. The charge adjustment device of claim 2 wherein the charging module is configured to wirelessly transmit the additional charge to the cap.

4. The charge adjustment device of claim 1 wherein the charge control module is configured to control supplemental charge storage in the cap to supply the additional charge to the battery.

5. The charge adjustment device of claim 1 wherein the desired charge amount indicates one of: (i) a voltage level of the battery and (ii) an additional charge time for the battery.

6. The charge adjustment device of claim 1 wherein the obtained information is the desired charge amount.

7. The charge adjustment device of claim 1 wherein:
the obtained information includes a transit time indicating a number of days the container was in transit to the residence; and
the charge determination module is configured to calculate the desired charge amount based on the transit time.

8. The charge adjustment device of claim 1 wherein:
the obtained information includes an initial charge level of the battery and a length of time for which access to the container is to be permitted; and
the charge determination module is configured to calculate the desired charge amount based on the initial charge level and the length of time.

9. The charge adjustment device of claim 1 wherein:
the obtained information includes an initial charge level of the battery, a quantity of drugs in the container, and a prescribed number of drugs to be taken per day;
the charge determination module is configured to calculate a length of time based on the quantity of drugs in the container and the prescribed number of drugs to be taken per day; and
the charge determination module is configured to calculate the desired charge amount based on the initial charge level and the length of time.

10. A system comprising:
the charge adjustment device of claim 1; and
the cap, wherein the cap includes:
a pushbutton; and
a lock control module configured to, in response to actuation of the pushbutton, selectively unlock the cap to permit separation of the cap from the container.

11. The system of claim 10 wherein:
the cap includes a solenoid that selectively prevents movement of the cap with respect to the container; and
the lock control module is configured to connect the battery to the solenoid to unlock the cap.

12. The system of claim 10 wherein the lock control module is configured to unlock the cap only in response to determining based on the obtained information that access is permitted to the container.

13. The system of claim 12 wherein the lock control module is configured to determine whether access is permitted to the container based on a comparison of a current date to regimen instructions programmed into the cap.

14. The system of claim 13 wherein the lock control module is configured to determine whether access is permitted to the container based on a comparison of the current date and a current time to the regimen instructions.

15. The system of claim 13 wherein the lock control module is configured to update the regimen instructions based on information from the remote data source received wirelessly from the charge adjustment device.

16. The charge adjustment device of claim 1 wherein the container identification module is configured to determine the RX ID of the cap by reading a printed image on the cap that encodes the RX ID.

17. The charge adjustment device of claim 1 wherein the container identification module is configured to determine the RX ID of the cap based on at least one of:
a wireless network identifier of a wireless communication circuit of the cap; and
user data included in a message transmitted from the cap over a wireless communication channel.

18. The charge adjustment device of claim 1 wherein the charge control module is configured to, in response to the information indicating that access to the container should be terminated, control a dissipation circuit of the cap to dissipate charge from the battery.

19. A non-transitory computer-readable medium storing processor-executable instructions, the instructions comprising:
determining a prescription identifier (RX ID) of a cap attached to a container;
establishing a connection with a remote data source over a network;
obtaining information, according to the RX ID, from the remote data source over the network, wherein the obtained information includes at least one of (i) an initial charge level of a battery of the cap and (ii) a length of time for which access to the container is to be permitted;
based on the obtained information, calculating a desired charge amount of the battery of the cap; and
selectively controlling additional charge to be supplied to the battery based on the desired charge amount.

20. A non-transitory computer-readable medium storing processor-executable instructions, the instructions comprising:
determining a prescription identifier (RX ID) of a cap attached to a container;
establishing a connection with a remote data source over a network;
obtaining information, according to the RX ID, from the remote data source over the network;
based on the obtained information, calculating a desired charge amount of a battery of the cap; and
selectively controlling additional charge to be supplied to the battery based on the desired charge amount.

* * * * *